(12) United States Patent
Ku et al.

(10) Patent No.: US 11,408,060 B2
(45) Date of Patent: Aug. 9, 2022

(54) HIGH PERFORMANCE SOLID LUBRICATING TITANIUM AMORPHOUS ALLOY

(71) Applicants: LG ELECTRONICS INC., Seoul (KR); SEOUL NATIONAL UNIVERSITY R&DB FOUNDATION, Seoul (KR)

(72) Inventors: Kyoung Jin Ku, Seoul (KR); Dong Han Kim, Seoul (KR); Joungwook Kim, Seoul (KR); Hangjin Ban, Seoul (KR); Bumdong Sa, Seoul (KR); Eun Soo Park, Gyeonggi-do (KR); Wook Ha Ryu, Gyeongsangbuk-do (KR); Kyung-Jun Kim, Gyeongsangbuk-do (KR); Jinwoo Kim, Seoul (KR); Heh Sang Ahn, Gyeonggi-do (KR)

(73) Assignees: LG Electronics Inc., Seoul (KR); Seoul National University R&DB Foundation, Seoul (KR)

( * ) Notice: Subject to any disclaimer, the term of this patent is extended or adjusted under 35 U.S.C. 154(b) by 4 days.

(21) Appl. No.: 16/484,387

(22) PCT Filed: Jan. 30, 2018

(86) PCT No.: PCT/KR2018/001279
§ 371 (c)(1),
(2) Date: Aug. 7, 2019

(87) PCT Pub. No.: WO2018/147585
PCT Pub. Date: Aug. 16, 2018

(65) Prior Publication Data
US 2020/0002794 A1 Jan. 2, 2020

(30) Foreign Application Priority Data

Feb. 7, 2017 (KR) .................. 10-2017-0017035
Feb. 7, 2017 (KR) .................. 10-2017-0017036
Feb. 7, 2017 (KR) .................. 10-2017-0017037

(51) Int. Cl.
*C22C 45/10* (2006.01)
*C23C 14/16* (2006.01)
(Continued)

(52) U.S. Cl.
CPC ............ *C22C 45/10* (2013.01); *C23C 14/165* (2013.01); *C23C 14/3407* (2013.01); *H01J 37/3426* (2013.01); *C22C 2200/02* (2013.01)

(58) Field of Classification Search
CPC ..................................................... C22C 45/10
See application file for complete search history.

(56) References Cited

U.S. PATENT DOCUMENTS

2006/0054250 A1* 3/2006 He .................. C22C 14/00
148/421
2007/0074790 A1 4/2007 Yamakoshi et al.
(Continued)

FOREIGN PATENT DOCUMENTS

CN 1403619 3/2003
CN 1659302 8/2005
(Continued)

OTHER PUBLICATIONS

Zhang et al, "Preparation of Ti—Cu—Ni—Si—B Amorphous Alloys with a Large Supercooled Liquid Region," Materials Transactions, JIM, 1999 vol. 40 Issue 4 pp. 301-306.*
(Continued)

*Primary Examiner* — Christopher S Kessler
(74) *Attorney, Agent, or Firm* — Fish & Richardson P.C.

(57) ABSTRACT

The present invention relates to an amorphous alloy having low frictional resistance and capable of improving abrasion resistance, a target made of the amorphous alloy, and a compressor comprising a layer of the amorphous alloy as a
(Continued)

coating layer. According to the present invention, it is possible to secure high hardness and a low elastic modulus of the coating layer by controlling a microstructure having an amorphous phase as a primary phase by using Ti-based three-component to five-component amorphous alloys. As a result, it is possible to prevent the coating layer from being peeled off from a matrix or destroyed, and thus it is possible to achieve the effect of improving reliability or durability of a mechanical apparatus such as a compressor.

7 Claims, 20 Drawing Sheets

(51) Int. Cl.
*C23C 14/34* (2006.01)
*H01J 37/34* (2006.01)

(56) References Cited

U.S. PATENT DOCUMENTS

| | | |
|---|---|---|
| 2014/0346038 A1 | 11/2014 | Shin et al. |
| 2016/0177430 A1 | 6/2016 | Shin et al. |
| 2016/0215383 A1 | 7/2016 | Park et al. |
| 2016/0289813 A1 | 10/2016 | Shin et al. |
| 2016/0341249 A1 | 11/2016 | Fang et al. |

FOREIGN PATENT DOCUMENTS

| | | |
|---|---|---|
| CN | 101152822 | 4/2008 |
| CN | 103409657 | 11/2013 |
| JP | H06264199 | 9/1994 |
| JP | 2015505903 | 2/2015 |
| KR | 20140145219 | 12/2014 |
| KR | 20160051400 | 5/2016 |
| KR | 20160092357 | 8/2016 |
| KR | 20160135558 | 11/2016 |
| KR | 1020010078526 | 9/2019 |

OTHER PUBLICATIONS

He et al, "Glass-forming ability and crystallization behavior of Ti—Cu—Ni—Sn—M (M=Zr, Mo, and Ta) metallic glasses," Journal of Applied Physics 95, 1816 (2004).*
Chinese Office Action in Chinese Appln. No. 201880010768.3, dated Oct. 30, 2020, 13 pages (with English translation).
Extended European Search Report in European Appln. No. 18750986.4, dated Aug. 10, 2020, 9 pages.
Liu et al., "Deposition of multicomponent metallic glass films by single-target magnetron sputtering," Intermetallics, Feb. 2012, 21(1):105-114.
Molokanov et al., "Temperature-time-transformation diagram of an amorphous titanium alloy," Metallovedenie I Termicheskaya Obrabotka, Jan. 1983, 10 pages (with English translation).
CN Office Action in Chinese Appln. No. 201880010768.3, dated May 12, 2021, 12 pages (with English translation).

* cited by examiner

HIGH PERFORMANCE SOLID LUBRICATING TITANIUM AMORPHOUS ALLOY

CROSS-REFERENCE TO RELATED APPLICATIONS

This application is a National Stage application under 35 U.S.C. § 371 of International Application No. PCT/KR2018/001279, filed on Jan. 30, 2018, which claims the benefit of Korean Application No. 10-2017-0017037, filed on Feb. 7, 2017, Korean Application No. 10-2017-0017036, filed on Feb. 7, 2017, and Korean Application No. 10-2017-0017035, filed on Feb. 7, 2017. The disclosures of the prior applications are incorporated by reference in their entirety.

TECHNICAL FIELD

An amorphous alloy that may have low frictional resistance and may improve abrasion resistance, a sputtering target that forms a coating layer made of the amorphous alloy, and a compressor including the coating layer are disclosed herein.

BACKGROUND ART

In general, air conditioning apparatuses such as air conditioners and refrigerators include mechanical devices such as compressors. Such a compressor uses a principle of applying mechanical energy to fluid by compressing the fluid, so that reciprocating motion or rotational motion is essential to compress the fluid.

Operation of such a compressor necessarily involves friction or vibration between mechanical components included in the compressor. For example, in compressors that are operated based on rotation, such as rotary compressors or scroll compressors, the friction of a rotary shaft may not be avoided.

In general, additional mechanical components, such as a bearing, are used to reduce the frictional resistance first, to improve the friction in the compressor. Further, a coating layer reduces the frictional resistance between the rotary shaft and the bearing.

In related art, a liquid lubricating layer is mainly used as a coating layer. However, in recent years, efforts have been made to reduce the friction and/or abrasion, by mainly using solid lubricating layers as coating bearings.

As a method of using such a solid lubricating layer, various methods and processes of coating a solid material having excellent friction and abrasion properties at a portion of or all of components that mutually contact and performs relative motion and at one side or both sides of a friction surface to improve tribology property of the friction surface are known.

Further, as components of the solid lubricating layer, an organic-based composition for lubricating layer including a solid lubricant such as PTFE, $MoS_2$, $WS_2$, and flaky graphite, a ceramic filler, and a mixed material such as a resin such as silane coupling material to enhance adhesion to a base material, or a ceramic-based composition for lubricating layer having carbides or nitrides such as cBN, TiC, TiN, and the like, as main components, or composition for lubricating layers based on low-melting-point-metals such as Sn—Bi alloys, or a composite composition for lubricating layer including a solid lubricant such as PTEE $MoW_2$, $WS_2$, and flaky graphite, formed above a lubrite layer as an interlayer, or carbon-based composition for lubricating layer such as Diamond like carbon (DLC) are known.

Meanwhile, in recent years, as home appliances have become miniaturized, compressors are rapidly increasing their speeds and are miniaturized. The miniaturization and the high speed of the compressor indicate that conditions under which the compressor is operated become increasingly severe. In particular, a compressor designed for high-speed and miniaturized conditions may not degrade even under severe operating conditions to exhibit efficiency equal to or higher than that of a large-sized compressor.

However, components of the solid lubricating layer have technical limitations that the components of the solid lubricating layer are difficult to be used for the miniaturized and high-speed compressor, in related art.

For example, a ceramic-based coating layer has very high surface hardness and is advantageous in abrasion resistance, but most of them have a high elastic modulus of about 400 to 700 MPa. Such a high elastic modulus of the ceramic material differs greatly from the elastic modulus of metal base on which ceramic materials are coated or other metal components in which the friction occurs in the ceramic coating layer, which cause a problem of durability in the base having low elastic modulus or other metal components.

When a component having an interface at which the friction occurs resiliently absorbs stress that may occur during the reciprocating motion of a piston, friction and abrasion thereof may be reduced, and dimensional stability of the component may be remarkably improved.

Furthermore, an increase in elastic strain of the component leads to an increase in fracture toughness of the component. The improved fracture toughness may significantly improve reliability of the components. However, the ceramic material has a disadvantage of low elastic strain.

Meanwhile, in the case of DLC, an improvement in abrasion loss has been reported, compared to existing Lubrite coating, but affinity to an additive of oil used for the compressor is insufficient, so there is a limitation to improvement in properties of low-speed operation.

Therefore, there is an increasing demand for a solid coating layer or a component having a new component, which may replace the solid coating layer or components in related art, and further have an excellent elastic deformation capability, and a compressor that uses such a solid coating layer or component.

A related prior art is Korean Patent Laid-Open Publication No. 10-2014-0145219, which discloses a Zr-based amorphous alloy composition having a glass forming ability.

DISCLOSURE

Technical Problem

The present disclosure provides a coating layer that has new components and a microstructure to improve friction properties and abrasion resistance, in the coating layer of components, for example, compressors, of various types of mechanical devices, and air conditioning apparatuses such as air conditioners and refrigerators.

More specifically, the present disclosure provides a Ti—Cu—X amorphous alloy, as new coating layer, having a specific composition range and low elastic modulus, to provide a coating layer that has new amorphous coating that has reduced frictional resistance between components included in various types of mechanical devices.

The present disclosure also provides a Ti—Cu—Ni—X quaternary alloy that has new composition range, to form amorphous material even in a Ti-rich regime in which high-hardness phase that may reduce the frictional resistance may precipitate, to provide a coating layer that has new amorphous coating having improved frictional resistance and durability thereof.

The present disclosure also provides a Ti-based amorphous coating layer having a composite microstructure including an amorphous phase having a low elastic modulus as a main phase and including a B2 phase having ultra-high elastic strain limit and high toughness, to reduce frictional resistance.

The present disclosure also provides a crystalline sputtering target having remarkably excellent thermal stability, compared to the amorphous material, which is made of ternary, quartenary or quinary alloy including Ti having a specific composition range, in which a glass forming ability is provided, to form the amorphous coating layers.

Further, the present disclosure also provides a mechanical device that has a coating layer having improved frictional resistance, abrasion resistance, and aging properties compared to the case in related art by forming the coating layer using the sputtering target.

Technical Solution

In order to solve the above-mentioned problem, according to an aspect of the present disclosure, a Ti-based amorphous alloy including Ti and Cu; and further including a third element (X) that may form a Ti—Cu—X ternary eutectic system may be provided.

Preferably, the Ti-based amorphous alloy in which the third element (X) is Ni or Co may be provided.

At this time, the Ti-based amorphous alloy in which the alloy is indicated by atom %, and has a composition range of 65 to 73.2% of Ti, 9.1 to 20% of Cu, and 10 to 21.8% of Ni may be provided.

(In the present disclosure, % in composition refers to atom % or at. % unless otherwise specified.)

In particular, the Ti-based amorphous alloy in which the alloy is indicated by atom % and has a composition range of 67.5 to 70% of Ti, 10 to 17.5% of Cu, and 15 to 20% of Co may be provided.

Preferably, the Ti-based amorphous alloy in which the third element (X) forms an inter-metallic compound with Ti may be provided.

At this time, the Ti-based amorphous alloy in which the inter-metallic compound is $Ti_2Ni$ or $Ti_2Co$ may be provided.

According to another aspect of the present disclosure, the Ti-based amorphous alloy including Ti, Cu, and Ni; and further including a fourth element (X) that may form eutectic points with respect to all of a Ti—X binary alloy, a Cu—X binary alloy, and a Ni—X binary alloy may be provided.

Preferably, the Ti-based amorphous alloy in which an atomic radius of the fourth element X is different from that of atomic radius of each of Ti, Cu, and Ni, by 12% or more may be provided.

Preferably, the Ti-based amorphous alloy in which the fourth element (X) has negative heat of mixing when the fourth element (X) is mixed with Ti, Cu, and Ni, respectively, may be provided.

Preferably, the Ti-based amorphous alloy in which the fourth element (X) is Si may be provided.

At this time, the Ti-based amorphous alloy in which the alloy is indicated by atom % and has a composition of 59.2 to 80% of Ti, 4.6 to 20% of Cu, 4.6 to 25% of Ni, 9% or less of Si (excluding 0) may be provided.

Particularly, the Ti-based amorphous alloy in which the alloy is indicated by atom % and has a composition range of 59.2 to 80% of Ti, 4.6 to 15% of Cu, 9.1 to 20% of Ni, 9% or less of Si (excluding 0) may be provided.

Furthermore, the Ti-based amorphous alloy in which the Ti forms an inter-metallic compound with Cu and/or Ni may be provided.

Alternatively, the Ti-based amorphous alloy in which the Si forms titanium silicide, with Ti, may be provided.

According to yet another aspect of the present disclosure, the Ti-based amorphous alloy including Ti, Cu, Ni, and Mo; and having a microstructure having an amorphous material as a base or a main phase and further including a B2 phase may be provided.

Preferably, the Ti-based amorphous alloy in which the alloy further includes Si may be provided.

At this time, the Ti-based amorphous alloy in which the alloy is indicated by atom % and has a composition rage of 48.4 to 65% of Ti, 14.3 to 41% of Cu, 8.6 to 20% of Ni, 1 to 5% of Mo, and 1% or less of Si (including 0%) may be provided.

According to another aspect of the present disclosure, a sputtering target, including any of the above compositions of the amorphous alloy, may be provided.

Preferably, the sputtering target in which the microstructure of the target is made of crystalline material may be provided.

In particular, the sputtering target in which an average grain size of the target ranges from 0.1 to 10 µm may be provided.

According to yet another aspect of the present disclosure, the sputtering target including any one of the above compositions of the amorphous alloy may be provided.

According to yet another aspect of the present disclosure, a compressor including a coating layer made of any one of the amorphous alloys may be provided.

Preferably, the compressor in which the coating layer is coated on a base including at least one of steel, iron, and aluminum-containing alloy, and the magnesium-containing alloy may be provided.

Advantageous Effects

According to the present disclosure, as a composition of the Ti amorphous alloy has an excellent glass forming ability, it may include an amorphous material or may have a nano-sized microstructure having amorphous material as a main phase. As a result, the microstructure of the amorphous alloy of the present disclosure may provide relatively high hardness and low elastic modulus compared to general crystalline microstructure.

Further, according to the present disclosure, the Ti-based amorphous alloy has a glass forming ability in a composition regime having composition of Ti (Ti rich) higher than that of a Ti—Cu binary amorphous alloy, which is a prior art. As a result, it is possible to obtain a high-hardness property of an alloy in a Ti-rich regime and to form inter-metallic compound having relatively high hardness, thereby improving frictional resistance and durability thereof.

Meanwhile, according to the present disclosure, the quaternary amorphous alloy including Ti has an effect of further expanding the composition regime in which the amorphous material may be formed to the Ti-rich regime, compared to the binary or ternary amorphous alloy including the Ti. As a result, according to the present disclosure, the quaternary amorphous alloy including Ti promotes obtaining an inherent hard hardness property, in the Ti-rich regime, and obtaining additional hard-hardness through formation of inter-metallic compound and/or silicide, thereby further improving frictional resistance and durability thereof.

Further, according to the present disclosure, the Mo-added Ti-based amorphous alloy may form the B2 phase having a ultra-high elastic strain capable of reversible phase change at room temperatures by adding Mo, so that the friction and abrasion may be improved by absorbing the stress and/or the strain at an interface in which the friction occurs, at a reversible elastic strain regime and dimensional stability of components included in the mechanical device may be provided. Further, toughness of the Ti-based amorphous alloy material itself is improved due to the ultra-high elastic strain of the B2 phase, thereby improving reliability of components.

Meanwhile, according to the present disclosure, the thermal/mechanical stability of the sputtering target is greatly improved, so that fracture of the target may be significantly suppressed during a sputtering process, thereby improving stabilization of the sputtering process. Further, as it has a very uniform microstructure, it is possible to solve a compositional deviation between the target composition and the thin film composition, which may be caused due to a difference in sputtering yields of the respective components derived from the multi-components, in the ternary alloy, quaternary alloy or a quinary alloy, included in the target, so that provision of uniformity of the composition is advantageous.

Further, according to the present disclosure, the compressor has an amorphous coating layer coated with the Ti-based amorphous alloy having the above composition. As a result, it is possible to obtain an advantageous effect on the abrasion resistance and the friction properties of the compressor from the relatively high hardness of the amorphous microstructure. Further, as the low elastic modulus of the amorphous microstructure is similar to that of the metal as a base, it is possible to prevent the coating layer from being peeled or broken from the base, thereby improving the reliability or the durability of the compressor.

BEST MODEL

Figure 1:
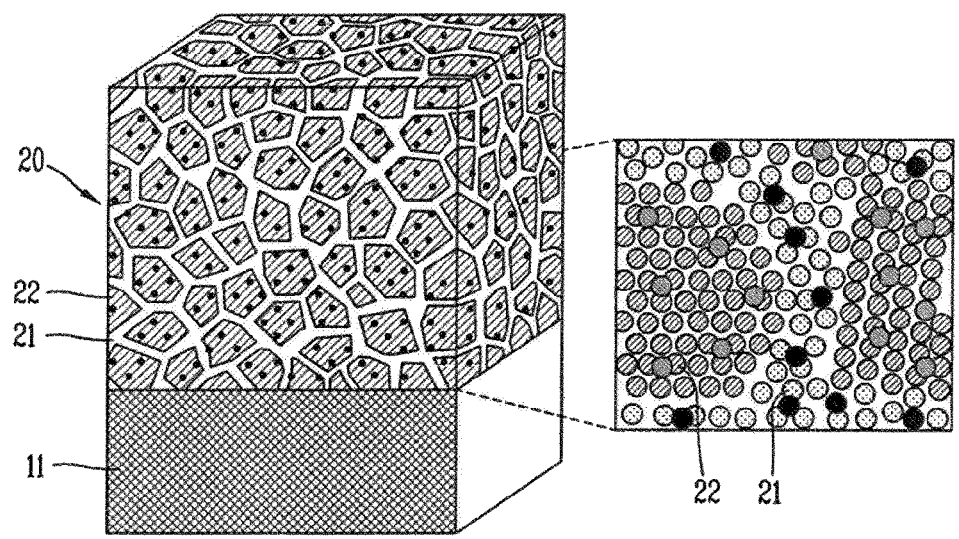
FIG. 1 is a conceptual view of an amorphous alloy or solid coating layer having an amorphous structure and a nanocrystalline structure of the present disclosure.

The present disclosure may be implemented in many different forms and is not limited to the embodiments described herein. The present embodiments are provided so that the disclosure of the present disclosure is complete and to convey the scope of the present disclosure. Further, for convenience of explanation, in the drawings, sizes of components may be exaggerated or reduced.

In order to clearly illustrate the present disclosure, technical explanation that is not directly related to the present disclosure may be omitted, and same or similar components are denoted by a same reference numeral throughout the present disclosure. Further, some embodiments of the present disclosure will be described in detail with reference to the exemplary drawings. In adding reference numerals to components of each drawing, the same components may have the same reference numeral as possible even if they are displayed on different drawings. Further, in describing the present disclosure, a detailed description of related known configurations and functions will be omitted when it is determined that it may obscure the gist of this application.

In describing components of the present disclosure, it is possible to use the terms such as first, second, A, B, (a), and (b), etc. These terms are only intended to distinguish a component from another component, and a nature, an order, a sequence, or the number of the corresponding components, are not limited by that term. When a component is described as being "connected", "coupled", or "connected" to another component, the component may be directly connected or able to be connected to the other component; however, it is also to be understood that an additional component may be "interposed" between the two components, or the two components may be "connected", "coupled" or "connected" through an additional component.

Further, with respect to implementation of the present disclosure, the present disclosure may be described by subdividing an individual component, the components of the present disclosure may be implemented within a device or a module, or a component of the present disclosure may be implemented by being divided into a plurality of devices or modules.

Hereinafter, according to a preferred embodiment of the present disclosure, a Ti-based amorphous alloy, a sputtering target that forms a coating layer made of the amorphous alloy, and a component (for example, a compressor) of a mechanical device including the coating layer will be described in detail with reference to the accompanying drawings.

Most solid materials are aggregates of microcrystals. In a three-dimensional space, each atom has a long range translational periodicity and is placed in a defined crystal lattice. To the contrary, a liquid material has a disordered structure lacking the translational periodicity because of vibration occurring due to heat.

In terms of atomic structure, the amorphous metal has a concept different from that of crystalline alloy in that the amorphous metal does not have long-range order patterns, which are typical atomic structures of the crystalline alloy and is a solid existing in a disordered state and having a structure of liquid.

In the present disclosure, the term "amorphous" includes a case having a property of an amorphous phase, which is generally known in the corresponding technical field to which the present disclosure pertains, for example, a case in which the amorphous structure having the general concept is provided as a main portion of the microstructure, and a case in which X-ray diffraction patterns have a widely diffused halo shape.

Furthermore, in the present disclosure, the term "amorphous" includes not only to the case in which the microstructure of the composition is made of a 100% amorphous material, but also to the case in which the amorphous phase exists as the main phase and does not lose the amorphous property, even though the crystalline material is partially included. Specifically, the present disclosure includes a case in which the crystalline material (or nanocrystalline material) is present or nitride and/or carbide precipitation is present, or some inter-metallic compounds are present, in the amorphous structure. The term "nanocrystalline material" refers to a metal alloy in which an average grain size is a nano-size (less than hundreds of nm or less).

In the present disclosure, a glass forming ability (GFA) refers to how easily an alloy that has a specific composition may be amorphized. In general, the GFA of metals and/or alloys depends largely on their compositions thereof and may be directly evaluated by calculating a critical cooling rate (hereinafter; referred to as "Rc") to form the amorphous material based on a continuous cooling transformation diagram or a time-temperature-transformation diagram.

However, in reality, it is not easy to obtain the Rc through experiments or calculations because physical properties such as melt viscosity or latent heat of fusion are different depending on the composition of each alloy.

High cooling rate having a predetermined level or more, which is the Rc or more, is required to form the amorphous alloys through casting which is a typical and general method. When a casting method in which a solidification speed is relatively slow (for example, a mold casting method) is used, a composition range to form the amorphous material is decreased. Unlike the above, through a rapid solidification method, such as melt spinning, in which a molten alloy is dropped onto a rotating Cu roll to solidify the alloy with a ribbon or a wire rod, an amorphous ribbon having thickness of tens of μm may be obtained using a maximized cooling rate of $10^4$ to $10^6$ K/sec or more, to expand the composition range to form the amorphous material. Therefore, through an evaluation of a degree of GFA with respect to a particular composition, a relative value is provided according to a cooling rate of a generally given cooling process.

In consideration of the relative properties of the GFA, the alloy having the GFA in the present disclosure refers to an alloy capable of obtaining an amorphous ribbon during casting, using the melt spinning method.

According to the present disclosure, the amorphous alloy may be used for various types of mechanical devices, for example, compressors, more specifically, a coating layer formed above a rotary shaft or a friction portion between the rotary shaft and the bearing. In the present disclosure, the coating layer may improve durability, low-friction property, heat resistance, and aging property.

FIG. 1 is a conceptual view of an amorphous alloy or a solid coating layer of the present disclosure.

According to the present disclosure, the solid coating layer shown in FIG. 1 shows an example in which the solid coating layer is formed above the friction portion between the rotary shaft and the bearing. FIG. 1 shows a coating layer 20 and a base 11 above which a coating layer 20 is formed. The base 11 above which the coating layer 20 is coated may include any material that may be used as a structural material. However, metals are more preferable than other materials as materials of the base 11 because rapid cooling due to inherent high thermal conductivity of the metal is possible to promote formation of an amorphous material of the coating layer 20.

In the present disclosure, the coating layer 20 may only be made of amorphous material 21 or may have amorphous material as a main phase, or may have a composite structure in which the amorphous material 21 and a nano-sized crystalline material 22 are mixed.

Figure 2:
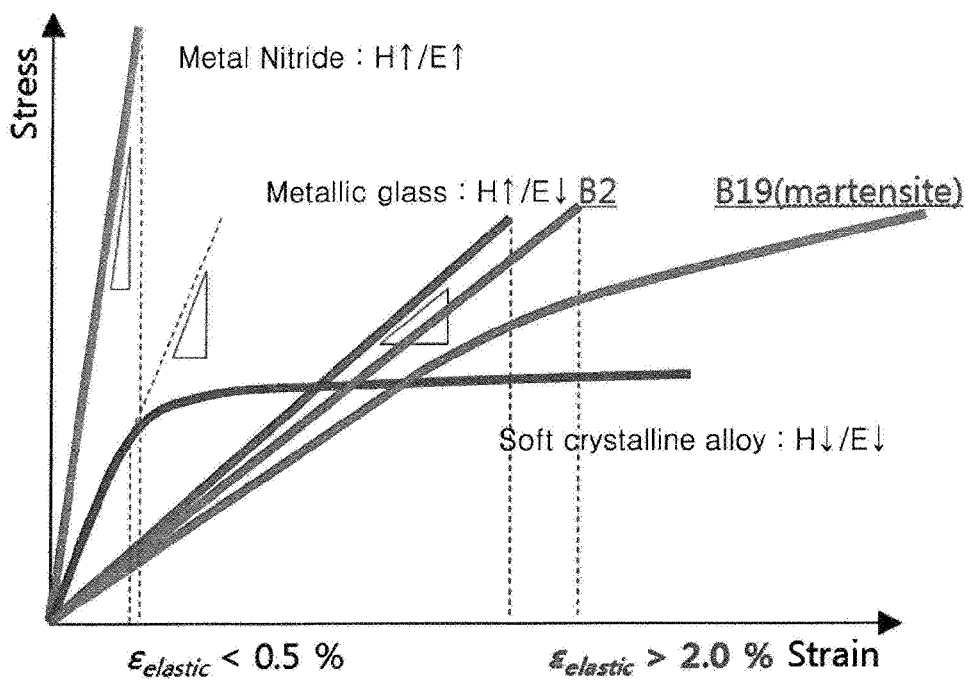
FIG. 2 is a stress-strain curve diagram related to comparing an amorphous metal with a metal nitride, a crystalline metal, a B2 phase, and a martensite phase.

FIG. 2 is a stress-strain curve related to comparing amorphous metal (metallic glass in FIG. 2) with metal nitride and crystalline metal.

The stress refers to a resistance to strain of a material when an external force is applied to the material. Strain refers to a ratio of an amount of strain of the material to an original length of the material. A slope in the stress-strain curve corresponds to an elastic modulus.

In general, the durability (reliability with respect to abrasion resistance) of the coating layer may be evaluated by a ratio (H/E) of hardness (H) to elastic modulus (E). The relatively large value of the ratio of the hardness to the elastic modulus refers to a low possibility that it is peeled or fractured due to the high durability of the coating layer.

When interfacial elasticity properties (or mechanical properties) between the base 11 and the coating layer 20 are not similar to each other, the coating layer 20 may be easily peeled off from the base 11 or may be fractured due to an influence on residual stress during strain. Inconsistency in elastic properties refers to a greater difference between the elastic modulus of the base 11 and the elastic modulus of the coating layer 20.

In related art, lubricating materials have high-hardness ceramic phase as a main portion thereof and have a greater elastic modulus. Accordingly, in related art, even though the lubricating materials precipitate a soft crystalline phase, they exhibit a low interfacial stability even when an initial lubrication performance is excellent as they have a greater difference in elastic modulus from that of the base 11. As a result, in related art, lubricating materials are not sufficiently sustainable because the lubricating materials are easily peeled from the base or fractured. The occurrence of peeling or fracture of the coating layer 20 refers to low durability (reliability with respect to abrasion resistance) of the coating layer 20.

In general, metal nitrides have very high hardness. However, the metal nitride has a high elastic modulus, as can be seen from the slope of the graph shown in FIG. 2. Further, the metal nitride has a low elastic strain of 0.5% or less. As a result, the metal nitride may form a high-hardness coating layer due to a relatively high hardness, but it is difficult to provide the durability due to the relatively high elastic modulus.

To the contrary, the crystalline metal has a very low elastic modulus, as can be seen from the slope of the graph shown in FIG. 2. Further, the crystalline metal has a low elastic strain of 0.5% or less, like the metal nitride. It is considered that the elastic strain limit of the crystalline metal is so less that a plastic deformation typically occurs from a strain of 0.2% or more (0.2% offset yield strain). Further, the hardness of the crystalline metal has much lower hardness than that of the metal nitride. As a result, in the case of the crystalline metal, the durability of the coating layer may be provided due to the low elastic modulus, while it is difficult to form the high-hardness coating layer due to the relatively low hardness.

As can be seen from the above results with respect to the metal nitride and the crystalline metal, the higher the hardness, the higher the elastic modulus. To the contrary, the lower the elastic modulus, the lower the hardness. Therefore, it is difficult to simultaneously improve the ratio of the hardness to the elastic modulus, which indicates that it is difficult to provide the durability of the hard-hardness coating layer based on high-hardness and low elastic modulus.

However, the present disclosure may implement the high hardness and the low elastic modulus through the microstructure of a composite structure made of amorphous material and nanocrystalline material. The hardness of the amorphous metal is lower than that of the metal nitride, but is greater than that of the crystalline metal. Referring to FIG. 2, the elastic modulus of the amorphous metal is much lower than that of the crystalline metal or the metal nitride. Further, an elastic strain limit of the amorphous metal is 1.5% or more, and the amorphous metal exhibits a wide elastic strain limit, thereby performing as a buffer between the coating layer and the friction material.

Therefore, unlike the general tendency in the metal materials described above, the amorphous metal has high hardness, a low elastic modulus, and a greater elastic strain. Accordingly, the ratio (H/E) of hardness of the amorphous metal to the elastic modulus has a greater value than that of the crystalline metal or the metal nitride.

As a result, the coating layer that uses the amorphous metal has an advantage that it has not only abrasion resistance caused due to the high hardness of the amorphous material but also the reliability (the durability).

More specifically, as the coating layer 20 of the present disclosure shown in FIG. 1 is made of a material and has a composition having a forming ability of the amorphous material 21, it is possible to form a composite structure made of the amorphous material 21 and the nanocrystalline material 22. As described above, the peeling or fracture of the coating layer 20 occurs due to the inconsistency in the interfacial elastic properties (or mechanical properties) between the base 11 and the coating layer 20. However, according to the present disclosure, as the coating layer 20 including the amorphous material 21 has the high hardness and a low elastic modulus value compared to the crystalline alloy, it is possible to minimize the peeling or the fracture of the coating layer 20 even though high hardness layer is formed through nitride and/or carbide precipitation phase and/or inter-metallic compound. Accordingly, according to the present disclosure, the coating layer 20 has greater durability (the reliability with respect to the abrasion resistance) compared to lubricating materials in related art.

Embodiment 1: Ti—Cu—X Ternary Amorphous Alloy

According to the present disclosure, an amorphous alloy is a first embodiment and includes a third element X capable of forming a Ti—Cu—X ternary eutectic system.

First, in the present disclosure, a Ti—Cu—X ternary alloy based on Ti is selected as Ti is a metal element that may react with other adding elements to form an inter-metallic compound which is advantageous in an implementation of ultra-high hardness. Further, the higher the content of Ti (Ti rich), the higher the hardness of the alloy. However, even when the alloy has the high hardness, when there is an inconsistency in interfacial elasticity properties with the base, fracture or peeling of the coating layer may occur.

Accordingly, in the present disclosure, a Ti—Cu—X ternary alloy is designed to have a composition to form an amorphous microstructure for similarity between an elastic property of the base and the elastic property of the coating layer, in other words, to have the GFA.

Similar to general metals, in the case of Ti alloy, a crystalline alloy is mainly made in a general composition and manufacturing method thereof, a composition to have the GFA has a narrow range. However, the GFA is not sufficiently provided and there is a limitation in an improvement of various types of properties that vary depending on the composition thereof due to an excessively narrow composition range.

Therefore, in the present disclosure, a Ti—Cu—X ternary alloy that may lower a melting point compared to a binary Ti alloy in related art and may form a high-hardness phase with Ti is designed, to develop an alloy having the GFA over a wide composition range.

First, in the present disclosure, a composition range to have the GFA of various types of Ti-based binary alloys is examined. Examination of Ti-based binary alloys may be necessarily preceded to determine the GFA of Ti—Cu—X ternary alloys. Phase diagrams and amorphous properties of Ti—Cu, Ti—X, and Cu—X may be provided first to know a liquid regime and a microstructure of the Ti-based ternary alloys, and it is required to know an interaction among three components when the three components form an alloy, to design the Ti—Cu—X ternary alloy.

Figure 3:
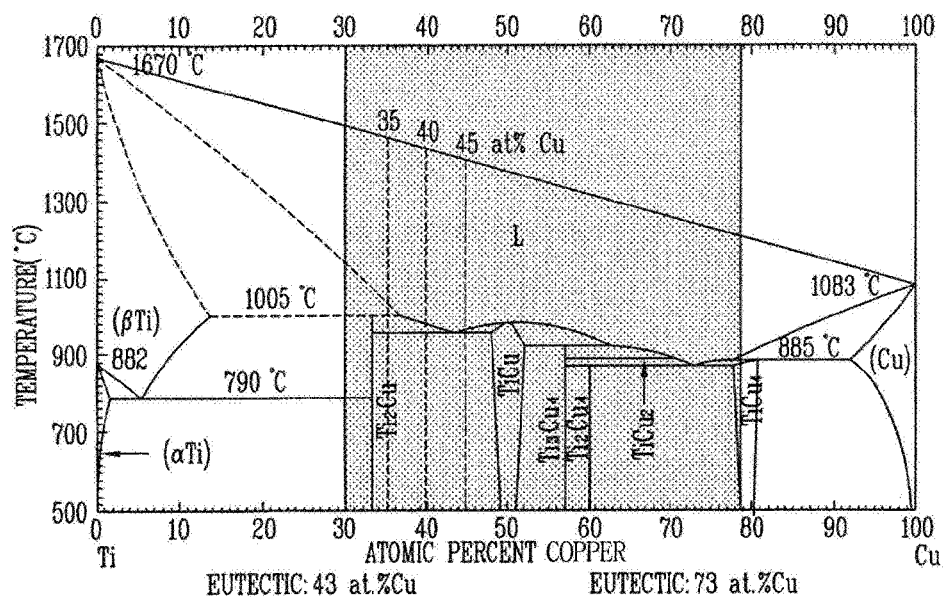
FIG. 3 is a phase equilibrium diagram of Ti—Cu binary alloys.

FIG. 3 is a phase diagram of Ti and Cu for explaining a composition range to have a GFA of a Ti—Cu binary alloy made of Ti and Cu.

A composition to have the GFA in a binary alloy may be determined in a composition range including an eutectic point, in the same manner as a ternary alloy. As can be seen from the term "eutectic", the eutectic point refers to a temperature in which a liquid phase of the alloy may be maintained to a lowest temperature, in an alloy system.

In general, a transfer phenomenon of mass, for example, convection of liquid phases or diffusion of solid phases, is classified into a thermal activation process. Therefore, as the melting point is lower, the liquid phase may exist at a lower temperature. Therefore, when the liquid phase is phase-transformed into a solid phase, the movement of the material is slowed, and a possibility of forming a crystalline material, which is an equilibrium phase, is further lowered.

Phase transformation from liquid phase to solid phase always requires under-cooling due to an energy barrier of solid-liquid interfacial energy generated during nucleation process of the solid phase, which indicates that the liquid phase is also present at a temperature substantially lower than a thermodynamic equilibrium temperature.

As a result, a composition near the composition corresponding to the eutectic point corresponds to a composition in which the liquid phase may exist at the lowest temperature in terms of thermodynamics, and further, the under-cooling occurs in the nucleation in terms of kinetics. As a result, the composition is the most advantageous to provide the GFA in the Ti—Cu—X ternary alloy.

Meanwhile, in FIG. 3, a regime in which a value of $\Delta T^*$ is 0.2 or more is shaded, where $\Delta T^*$ refers to a relative drop in melting point of the alloy. $\Delta T^*$ represents a difference between a predicted melting point according to a mixing ratio corresponding to a specific composition, based on the melting point of each element, and an actual melting point, by a ratio shown in the following equation.

$$\Delta T^* = (T_m^{mix} - T_m)/T_m^{mix}$$

($T_m^{mix} = \Sigma X_i T_m^i$, $X_i$=mole fraction, $T_m^i$=melting temperature)

As shown in FIG. 3, it was examined that the Ti—Cu binary alloy is indicated by atom % (hereinafter; in the present disclosure, % related to composition refers to atom %) and has eutectic point at 43% of Cu and 73% of Cu, respectively, and regime $\Delta T^*$ is 0.2 or more, in the composition of 30 to 78% of Cu. However, it was measured that the composition regime in which the amorphous material is formed by the melt spinning method is a regime in which 35 to 40% of Cu is provided.

Figure 4:
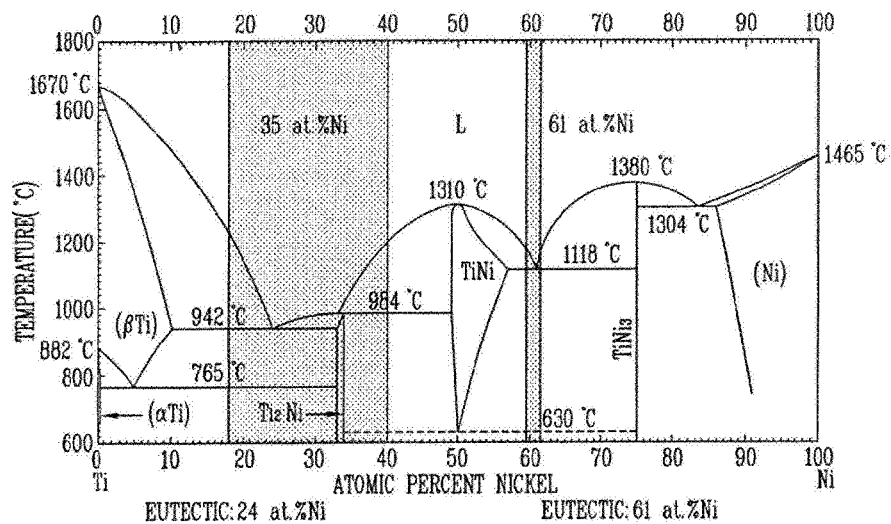
FIG. 4 is a phase equilibrium diagram of Ti—Ni binary alloys.

FIG. 4 is a phase diagram of Ti and Ni for explaining a composition range to have a GFA of a Ti—Ni binary alloy made of Ti and Ni. As shown in the phase diagram of FIG. 4, it was examined that the Ti—Ni binary alloy is indicated by atom % and has eutectic points at 24% of Ni and 61% of Ni, respectively, and $\Delta T^*$ is 0.2 or more, in a composition of 18 to 40% of Ni and about 61% of Ni.

Figure 5:
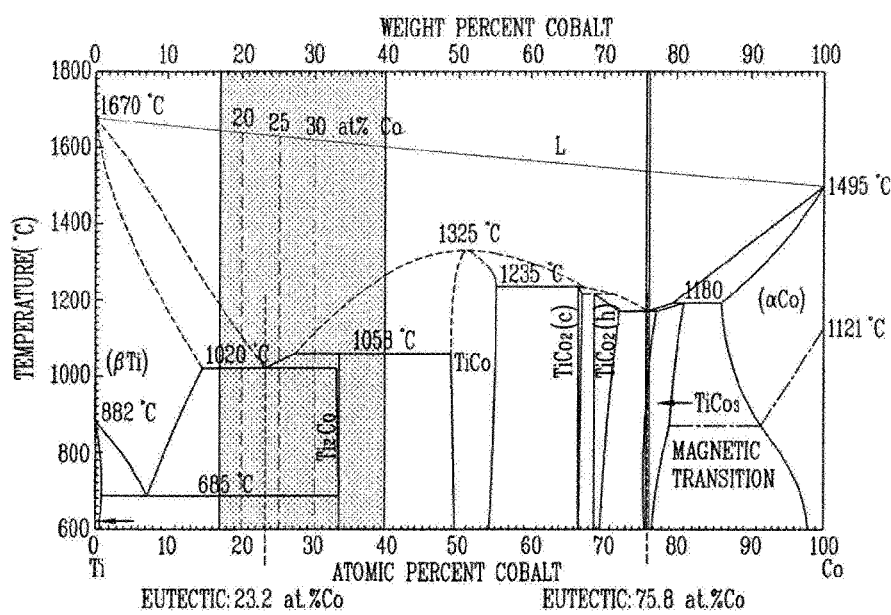
FIG. 5 is a phase equilibrium diagram of Ti—Co binary alloys.

FIG. 5 is a phase diagram of Ti and Co for explaining a composition range to have a GFA of a Ti—Co binary alloy made of Ti and Co. As shown in the phase diagram of FIG. 5, it was examined that the Ti—Co binary alloy is indicated by atom % and has eutectic points at 23.2% of Co and 75.8% of Co, respectively, and $\Delta T^*$ is 0.2 or more, in a composition of 17 to 40% of Co and about 75.8% of Co.

Meanwhile, Cu—Ni binary alloy is known to form a homogeneous solid solution in a liquid phase and a solid phase thereof. Further, Cu—Co may not form an eutectic system.

From the phase diagram of FIGS. 3 to 5 and the phase diagram of Cu—Ni and Cu—Co alloy system, it can be seen that the binary alloy made of Ti and Cu has the widest composition range with respect to the GFA. Thus, in the present disclosure, an alloy in Ti—Cu—X ternary eutectic system including Ni and Co that may form the ternary eutectic system to lower a composition ratio of the liquid phase, based on the Ti—Cu binary alloy, as a third element, is invented.

In the present disclosure, a method of manufacturing the amorphous alloy and evaluating the GFA is described as follows.

First, the Ti-based amorphous alloy composition that has the desired component is implemented with an amorphous alloy casting material, an amorphous alloy powder, and an amorphous alloy ribbon having a foil-shape. Methods for implementing the above are widely known in the art to which the present disclosure pertains, and examples of the methods include a rapid solidification method, a die casting method, a high-pressure casting method, an atomizing method, and a melt spinning method.

In the present disclosure, first, an alloy button having a desired composition was prepared using a vacuum arc remelting method. Then, the alloy that has the button shape was re-dissolved again to prepare a molten metal alloy, and the molten metal alloy was injected into a surface of a Cu roll rotating at a high speed through a nozzle to rapidly solidify the molten metal alloy to prepare a ribbon-shaped molten metal alloy.

Whether a metal ribbon manufactured through the melt spinning method is made of amorphous material is discriminated using an X-ray diffraction (XRD) method widely known in the art to which the present disclosure pertains.

FIGS. 6 to 9 show compositions in which amorphous materials may be formed in Ti—Cu—Ni ternary alloy and XRD results.

Figure 6:
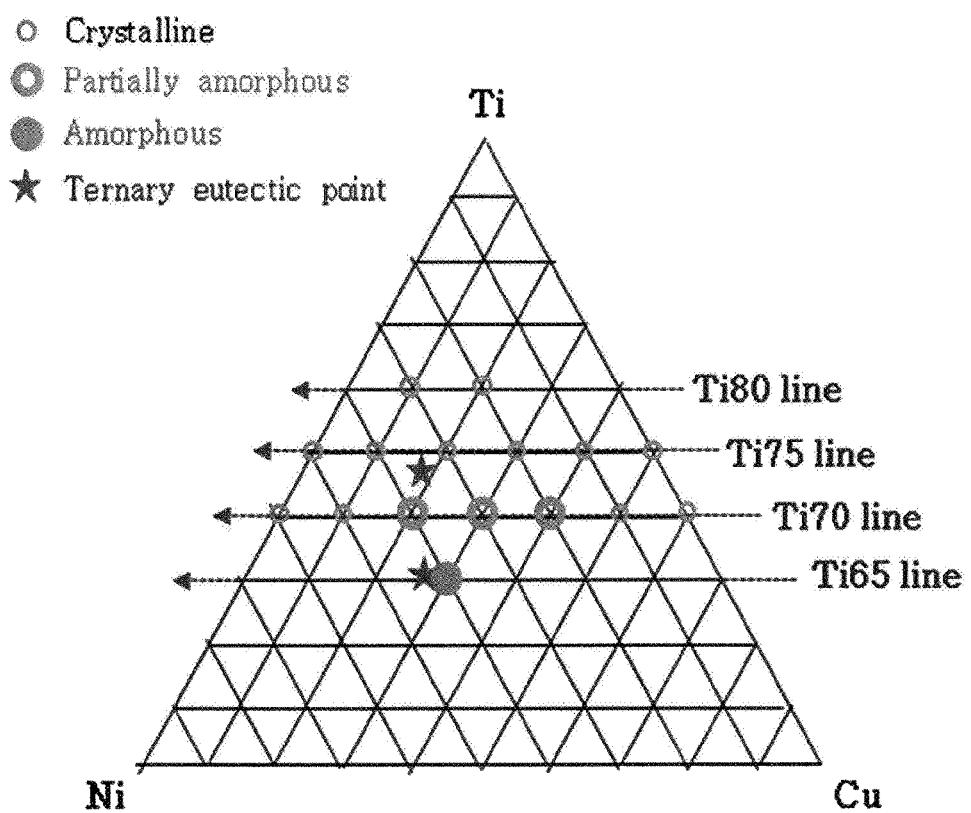
FIG. 6 shows a Gibbs triangle indicating compositions of Ti—Cu—Ni ternary alloy that has a glass forming ability, which is test according to the present disclosure.

First, as shown in FIG. 6, there are two ternary eutectic points of Ti—Cu—Ni. First, there are an eutectic point corresponding to a composition of Ti-9.1% Cu-17.7% Ni represented by E4 and an eutectic point corresponding to a composition of Ti-12.9% Cu-21.8% Ni represented by E5.

Of course, there is an additional eutectic point in the Ti—Cu—Ni ternary alloy. However, in the present disclosure, the alloy in the Ti-rich regime capable of obtaining an effect of low elastic modulus (E) through the amorphous alloy and an effect of forming the high-hardness phases is invented.

Figure 7:
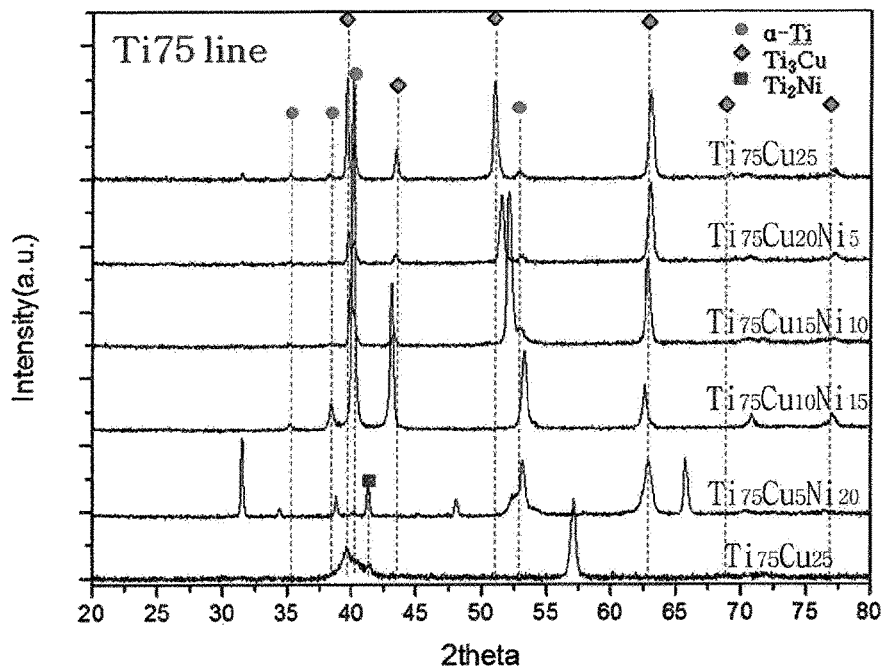
FIG. 7 shows XRD patterns of a glass forming ability of alloys having a composition range of Ti 75%-Cu x %-Ni y % (x+y=25).

First, the Ti—Cu—Ni ternary alloy in which the content of Ti is fixed to 75% and the contents of Cu and Ni are adjusted within the remaining range of 25% may not show the GFA in the examined regime (FIG. 7). Rather, it is determined that the GFA was locally or partially observed in the Ti-25% Ni binary alloy (FIG. 7) because there is an eutectic point at about 24% of Ni, in the Ti—Ni binary alloy (FIG. 4).

Figure 8:
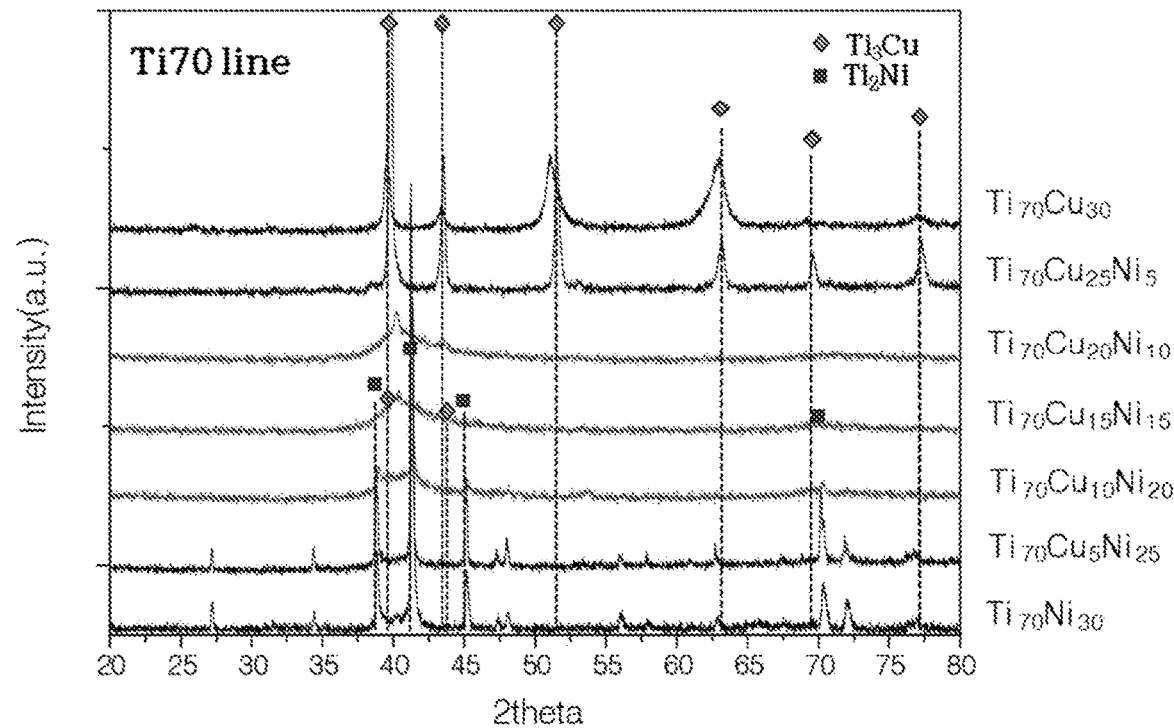
FIG. 8 shows XRD patterns of a glass forming ability of alloys having a composition range of Ti 70%-Cu x %-Ni y % (x+y=30).

To the contrary, from FIG. 8, it was confirmed that the Ti—Cu—Ni ternary alloy in which the content of Ti is 70% and contents of Cu and Ni are adjusted in the remaining range of 30% has a composition regime showing the GFA, in the examined regime. From the XRD results, it can be seen that the main phase is an amorphous material, in the composition regime in which the content of Cu+Ni is 30% and the content of Cu is 20 to 10% and the content of Ni is 10 to 20%. Furthermore, when the content of Ni is increased from 10% to 20% in the composition regime, a weak diffraction peak with respect to the $Ti_2Ni$ phase is observed from the XRD results, which indicates that the Ti-10% Cu-20% Ni ternary alloy has a composite microstructure in which a high-hardness $Ti_2Ni$ phase coexists in an amorphous main phase. The alloy has a low elastic modulus (E) property of the amorphous material and high-hardness phase (H) as advantages of a $Ti_2Ni$ phase.

Figure 9:
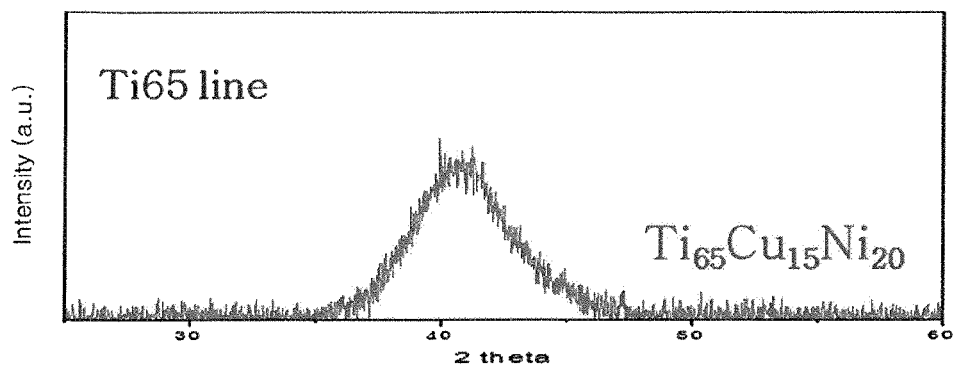
FIG. 9 shows XRD patterns of a glass forming ability of an alloy having a composition range of Ti 65%-Cu 15%-Ni 20%.

On the other hand, a Ti—Cu—Ni ternary alloy having a Ti content reduced to 65% also had a composition regime to have a GFA. In particular, the Ti-15% Cu-20% Ni ternary alloy near the Ti—Cu—Ni ternary system showed the same XRD peak as the other Ti—Cu—Ni ternary alloy showing the GFA (FIG. 9).

According to the present disclosure, from the above XRD results, it was confirmed that the Ti—Cu—Ni ternary alloy system had a GFA in a composition range of 65 to 73.2% of Ti, 9.1 to 20% of Cu, and 10 to 21.8% of Ni.

Meanwhile, according to the present disclosure, in the case of the composition range to have the GFA in a Ti—Cu—Ni ternary alloy, the composition range with respect to the GFA is very expanded, compared to the composition range of 35 to 40% of Cu in which the GFA is provided, in the Ti—Cu binary alloy, which indicates that the Ti—Cu—Ni ternary alloy of the present disclosure has the expanded stable GFA and expansion in composition range in which the property is enhanced, compared to the binary alloy, such as a Ti—Cu alloy.

FIGS. 10 to 13 show liquidus line projection and XRD and DSC results through which a GFA is confirmed, in a Ti—Cu—Co ternary alloy, respectively.

Figure 10:
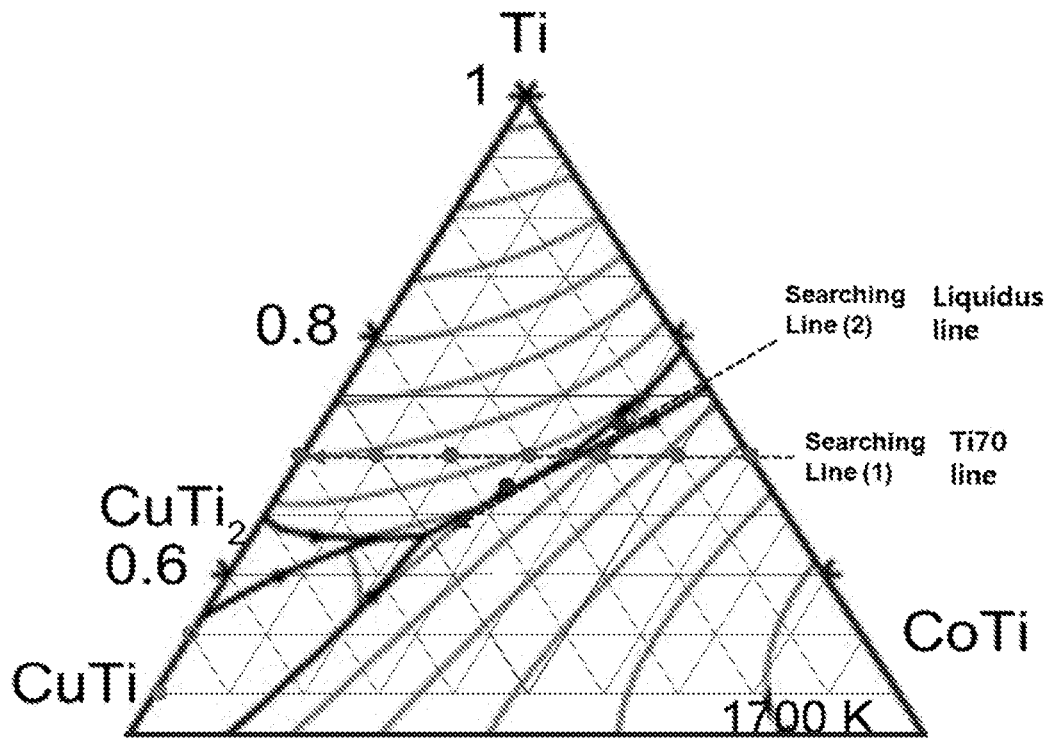
FIG. 10 shows a Gibbs triangle with liquidus lines of Ti—Cu—Co ternary alloy and compositions tested with respect to a glass forming ability according to the present disclosure.

First, as shown in FIG. 10, there is also a ternary eutectic point in the Ti—Cu—Co ternary alloy in the present disclosure.

In the present disclosure, first, the GFA with respect to a composition regime of searching line 1, in which the composition of Ti is fixed to 70% and contents of Cu and Ni are adjusted in the remaining range of 30%, and a composition regime corresponding to searching line 2 along the liquidus line was examined.

Figure 11:
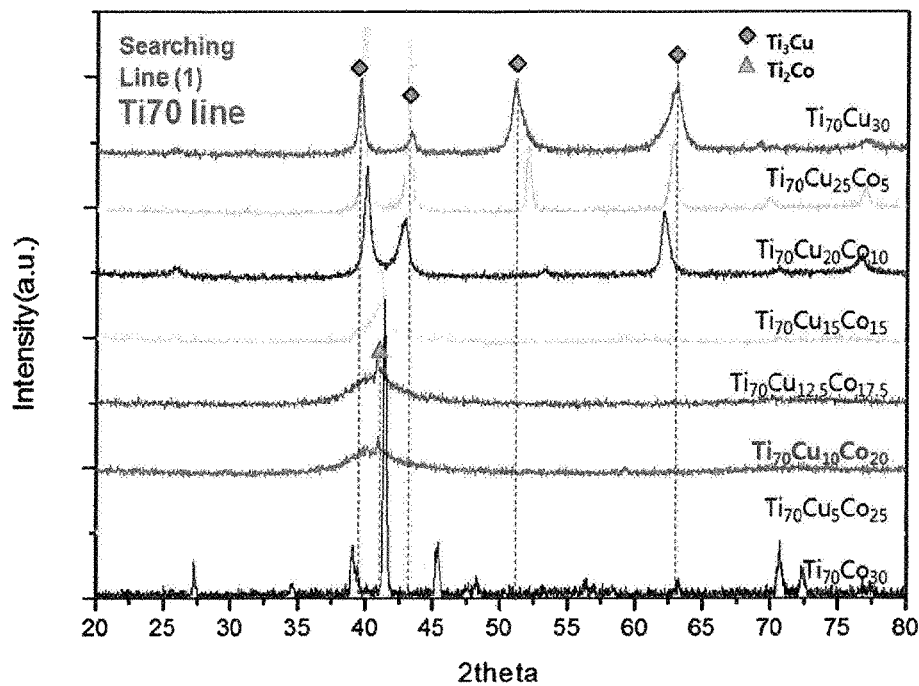
FIG. 11 shows XRD patterns of a glass forming ability of alloys that have a composition range of Ti 70%-Cu x %-Co y % (x+y 30).

As shown in FIG. 11, a Ti—Cu—Co ternary alloy in the composition regime corresponding to searching line 1 in which the content of Ti is 70% has the composition regime in which the GFA is provided in the examined regime.

Particularly, it was confirmed from the XRD results that the main phase is made of the crystalline material, in the composition regime in which the content of Cu is 12.5 to 10% and the content of Co is 17.5 to 20%. Further, in the composition regime of the amorphous material, a weak diffraction peak with respect to $Ti_2Co$ is observed from XRD results, which indicates that the Ti-(12.5 to 10)% Cu-(17.5 to 20)% Co ternary alloy has a composite microstructure in which a high-hardness $Ti_2Co$ phase coexists in the amorphous main phase. The alloy has a low elastic modulus (E) property and the hard hardness (H) of $Ti_2Co$ phase.

Figure 12:
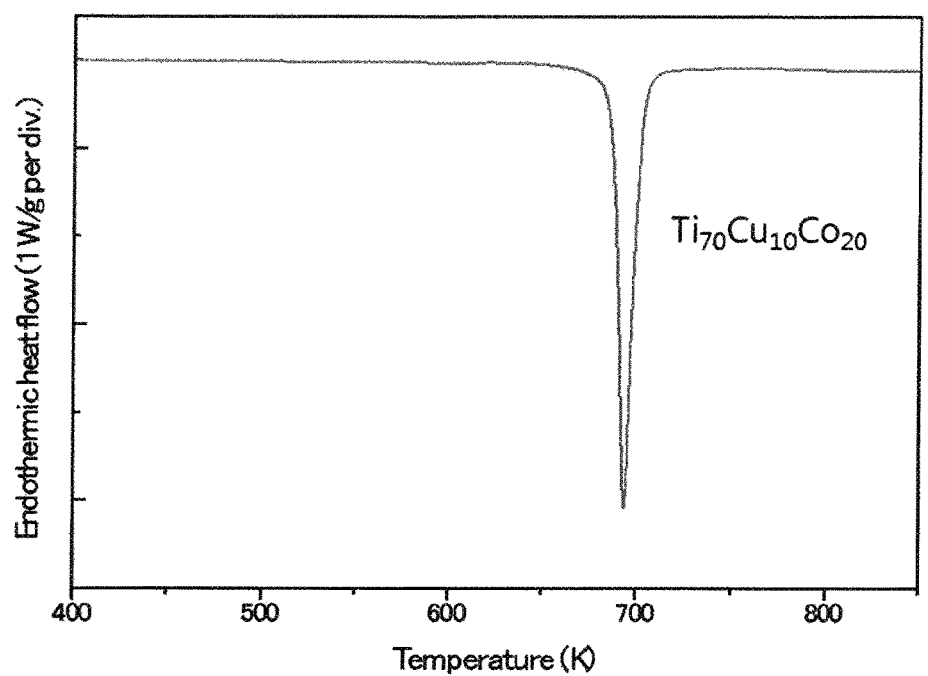
FIG. 12 shows a result of differential thermal analysis of an alloy including Ti 70%-Cu 10%-Ni 20%.

FIG. 12 shows a result of analyzing, by a differential scanning calorimeter (DSC), a Ti-10% Cu-20% Co alloy showing a GFA, from an XRD analysis.

The alloy that has the above composition exhibited a peak in which calorie is significantly increased at about 700K when the alloy is heated using the DSC, which is a general peak showing crystallization of the amorphous metal, and as a result of DSC analysis, it was analyzed that the crystallization temperature of Ti-10% Cu-20% Co alloy is about 675K.

Meanwhile, as can be seen from the liquidus lines in FIG. 10, a direction of an arrow in the searching line 2 is almost the same as a direction in which the composition of the liquid phase changes as the temperature of the Ti—Cu—Co ternary alloy is decreased, which indicates that the liquid phase may be present at a lower temperature as it proceeds in the direction of the arrow, that is, it proceeds to a portion in which greater Cu is provided. Thus, in the composition regime corresponding to searching line 2, as the greater Cu is, the lower the temperature of the liquid phase is maintained. Therefore, it is predicted that the GFA further increases.

Figure 13:
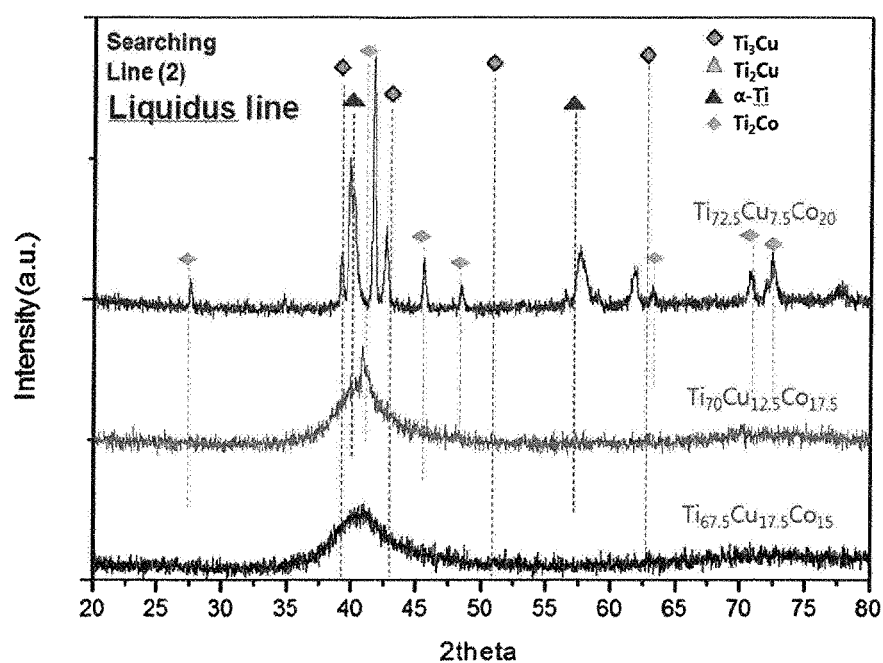
FIG. 13 shows XRD results of a glass forming ability with respect to a composition regime corresponding to searching line 2 along liquidus lines of the Ti—Cu—Co ternary alloy in FIG. 10.

FIG. 13 shows XRD results obtained by examining GFA with respect to a composition regime corresponding to searching line 2 along a liquidus line of a Ti—Cu—Co ternary alloy.

The results in FIG. 13 are exactly the same as the above prediction. First, Ti-7.5% Cu-20% Co alloy, which is in a regime where the content of Cu is less in the searching line 2, is made of a crystalline material without amorphous material. However, the Ti-12.5% Cu-17.5% Co alloy having a greater amount of Cu than that of the above content thereof has an amorphous phase as a main phase, and a $Ti_2Co$ phase is locally present. Finally, FIG. 13 shows XRD results indicating that almost all microstructures is made of the crystalline phase, in Ti-17.5% Cu-15% Co in which the content of Cu is further increased.

From the above XRD and DSC results, the Ti—Cu—Co ternary alloy system of the present disclosure has a GFA in the composition range of 67.5 to 70% of Ti, 10 to 17.5% of Cu, and 15 to 20% of Co.

Meanwhile, the above composition range to have the GFA in the Ti—Cu—Co ternary alloy is expanded compared to the composition range of 35 to 40% of Cu in which the GFA is confirmed in the Ti—Cu binary alloy, which indicates that the Ti—Cu—Co ternary alloy has the expanded stable GFA and expansion in composition range in which the property is enhanced, compared to the binary alloy such as a Ti—Cu binary alloy.

Embodiment 2: Ti—Cu—Ni—X Quaternary Amorphous Alloy

An amorphous alloy in Example 2 in the present disclosure is a Ti—Cu—Ni—X quaternary alloy that further includes a fourth element (X) that may form eutectic points at Ti—X binary alloy, Cu—X binary alloy, and Ni—X binary alloy. In the present disclosure, in particular, a quaternary alloy is invented, where the quaternary alloy has a GFA in the composition regime in which content of Ti greater than that of Ti—Cu binary alloy or Ti—Cu—Ni ternary alloy (so called Ti rich) is provided.

The Ti—Cu—Ni—X quaternary alloy having the Ti-rich composition is selected because overall hardness of the alloy is increased as a content of Ti is increased. In particular, the higher the content of Ti, the higher the hardness of the amorphous matrix itself, and the easier it forms an intermetallic compound or a silicide favorable to implementing properties of ultra-high hardness, with the alloy element having different content of Ti. However, even if it has high hardness, when there is an inconsistency in interfacial elasticity properties with the base, fracture or peeling of a lubricating layer may occur. Therefore, in the present disclosure, a Ti—Cu—Ni—X quaternary alloy is designed to have a composition to form the amorphous microstructure for similarity in elastic properties between the base and the lubricating layer, in other words, to have the excellent GFA.

To this end, in the present disclosure, in order to develop an alloy having the GFA over a wide composition range, a Ti—Cu—Ni—X ternary alloy including X to lower the melting point thereof compared to the ternary alloy, based on the existing ternary Ti—Cu—Ni alloy and to react with Ti, thereby forming the high-hardness phase is designed.

In general, a phase diagram of a binary alloy (for example, a Ti—Cu alloy) may be expressed by a two-dimensional plane as shown in FIG. 3 described above. The binary phase diagram quantitatively shows thermodynamically most stable equilibrium phase(s) under certain conditions (e.g., composition or temperature) and a fraction of each phase.

Figure 14:
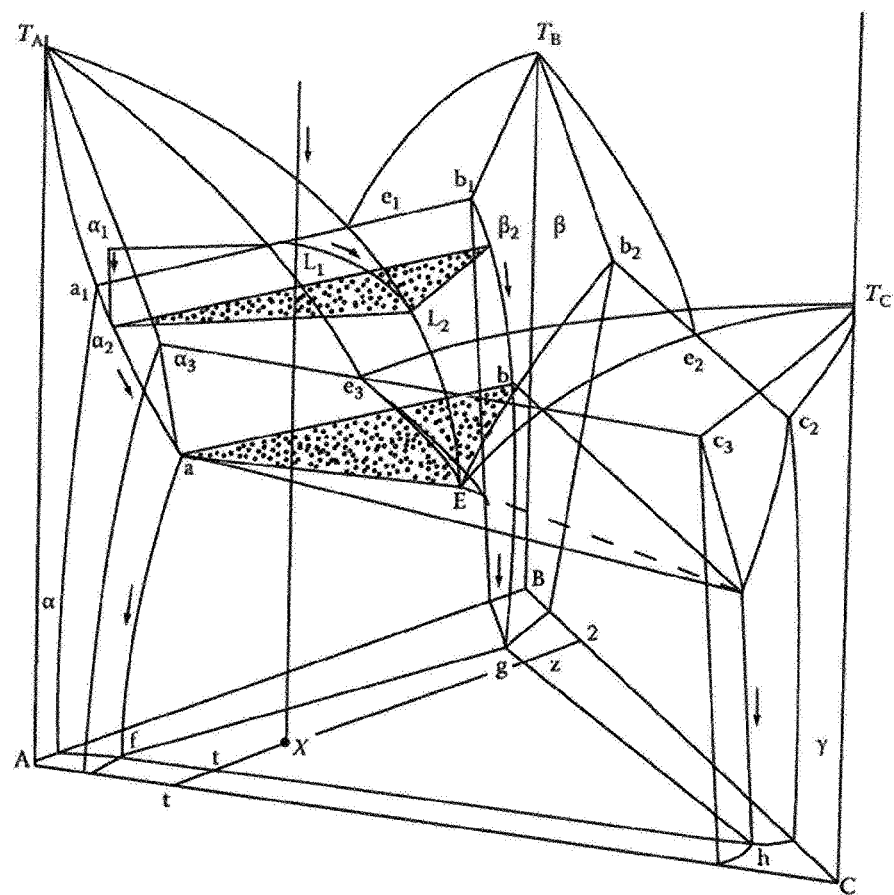
FIG. 14 shows an example of an equilibrium phase diagram of a ternary alloy.

Unlike the above, the phase diagram of the ternary alloy (for example, A-B-C alloy) has a three-dimensional trigonal column (FIG. 14). At this time, a triangle in a x-y plane of the trigonal column (commonly referred to as "a Gibbs triangle") refers to a composition range of three components and a z direction refers to a temperature. Therefore, unlike binary alloys, it is extremely difficult to measure and evaluate metallic information because an equilibrium phase diagram of the ternary alloy becomes a three-dimensional trigonal column rather than a two-dimensional plane due to the addition of a third element.

Further, in order to know the equilibrium phase and microstructure of Ti—Cu—Ni—X quaternary amorphous alloy to be invented in the present disclosure under specific conditions (for example, composition or temperature), four ternary phase diagrams are basically required (Ti—Cu—Ni, Ti—Cu—X, Ti—Ni—X, and Cu—Ni—X ternary phase diagrams), and interaction parameters among components may be determined when the X-component is added to the Ti—Cu—Ni ternary component.

However, the above information is difficult to be practically tested or evaluated.

Therefore, in the present disclosure, Ti, Cu, and Ni as components of the Ti—Cu—Ni ternary amorphous alloy and Ti—X, Cu—X, and Ni—X binary alloys, which are studied by the present inventors, are formed, a fourth element (X) that may lower a melting point of the binary alloys was examined first.

As described above, as the melting point is lower, in the alloy having a composition corresponding to the composition close to the eutectic point, the liquid phase thereof may present to the lowest temperature thermodynamically, and under-cooling is significantly required to precipitate polyphase at the same time. Also, in terms of kinetics, the lower the temperature, the slower the movement of a material. Thus, it is difficult for the crystalline material which is the equilibrium phase to be formed.

Figure 15:
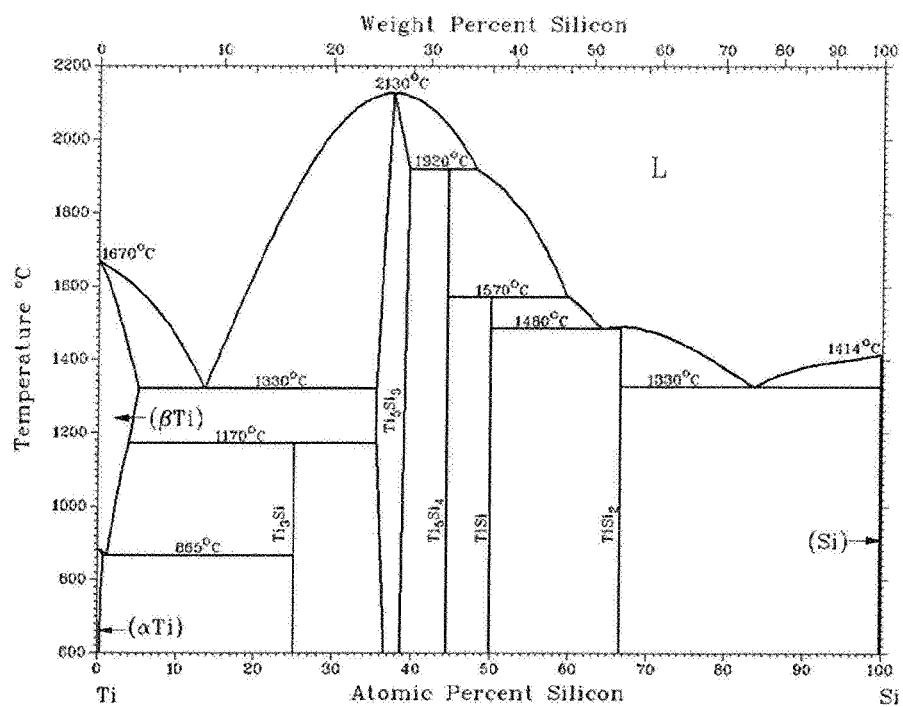
FIG. 15 is a phase equilibrium diagram of a Ti—Si binary alloy.
Figure 16:
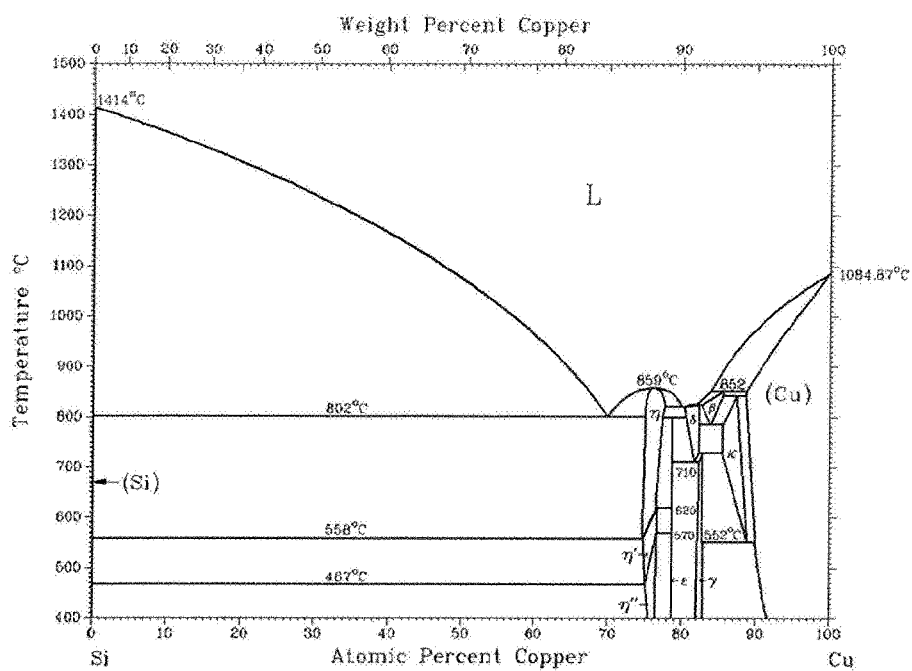
FIG. 16 is a phase equilibrium diagram of a Cu—Si binary alloy.
Figure 17:
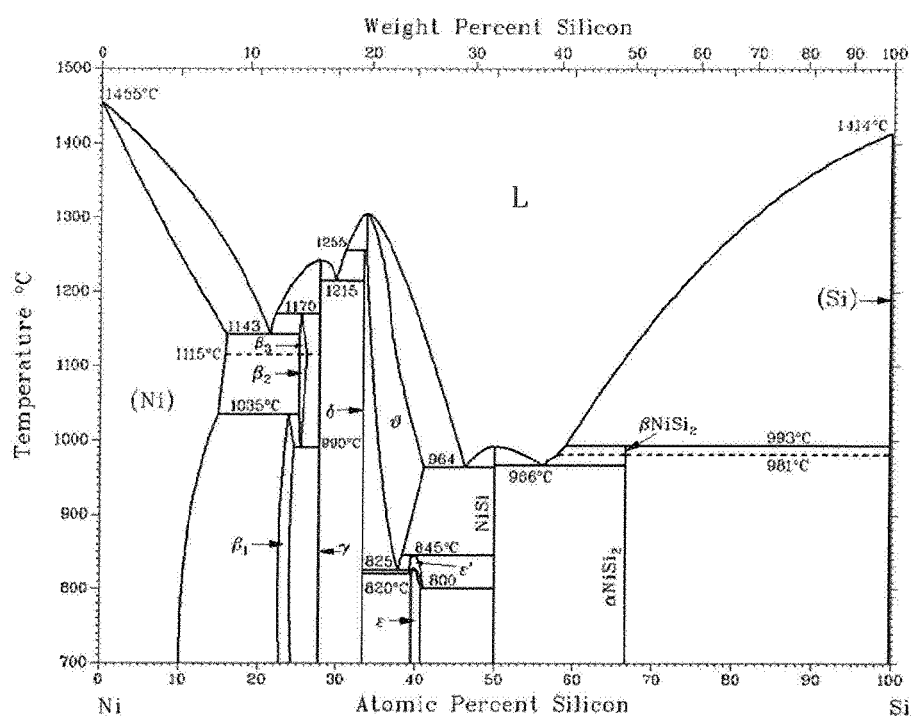
FIG. 17 is a phase equilibrium diagram of a Ni—Si binary alloy.

FIGS. 15 to 17 are Ti—Si, Cu—Si, and Ni—Si binary equilibrium phase diagrams, respectively.

As shown in the above phase diagrams, Si forms eutectic points with Ti, Cu and Ni. For example, when Si is added to Ti, the melting point of the Ti—Si alloy decreases as an amount of Si added increases, to about 13 at. % (Hereinafter; referred to as "%") of Si, which is a composition corresponding to the eutectic point. Therefore, in the present disclosure, Si is selected as one of the alloy elements capable of greatly lowering the melting point of the Ti—Cu—Ni ternary alloy in terms of the lowering of the melting point.

In order for metals to have the GFA, it is known that several empirical laws may be met. According to the present disclosure, it was examined that Si meets requirements that, among these empirical laws, there may be a greater difference of 12% or more in atomic radiuses among main elements and greater negative heat of mixing is provided among elements.

Figure 18:
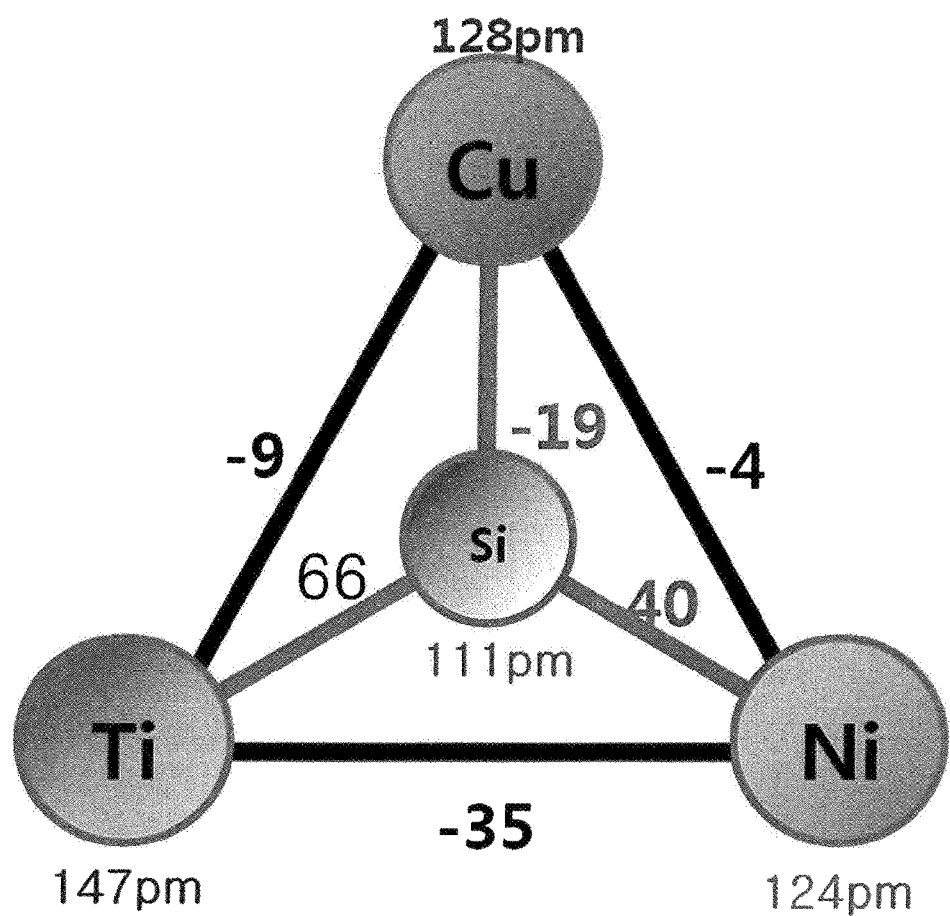
FIG. 18 shows differences in radiuses among components of a Ti—Cu—Ni—Si quaternary alloy and heat of mixing thereof.

FIG. 18 shows differences in radiuses among components and heat of mixing, of a Ti—Cu—Ni—Si quaternary alloy to be invented by the present disclosure.

As shown in FIG. 18, the atomic radius of Si is different from the atomic radius of each of Ti, Cu, and Ni by at least 12% or more. Further, the present inventors have found that, the heat of mixing of Si—Ti, Si—Cu, and Si—Ni has the negative heat of mixing, which has a greater absolute value thereof, compared to heat of mixing between components (that is, the heat of mixing of Ti—Cu, Ti—Ni, and Cu—Ni), in the Ti—Cu—Ni ternary amorphous alloy invented by another disclosure.

Due to the properties of Si, the present inventors have selected Si as the fourth element to provide the GFA in the Ti-rich composition regime of the Ti—Cu—Ni ternary amorphous alloy.

The best content of Si capable of providing the GFA does not correspond to a configuration which can be easily predicted or easily derived by the skilled person in the art because a degree of a decrease in the melting point with respect to the amount of Si added when Si is added to Ti, Cu, and Ni varies depending on each element, and the composition to form the silicide varies depending on Ti, Cu, and Ni, as shown in FIGS. 15 to 17.

Further, increasing the amount of Si added until the alloy has the composition corresponding to the eutectic point is advantageous in terms of lowering the melting point of the alloy, but there is a side effect that the higher the content of Si, the greater the fraction of silicide.

For example, as shown in FIG. 15, the addition of about 5% or more of Si in the Ti base causes the formation of the silicide. However, as some of the silicides have a melting point higher than the melting point of pure Ti and Si, the GFA of the alloy is deteriorated, and an excessive precipitation of silicide may lead to undesirable results in terms of mechanical properties.

Therefore, it is very important to derive the content of Si which may lower the melting point and inhibits the excessive precipitation of the silicide simultaneously.

Figure 19:
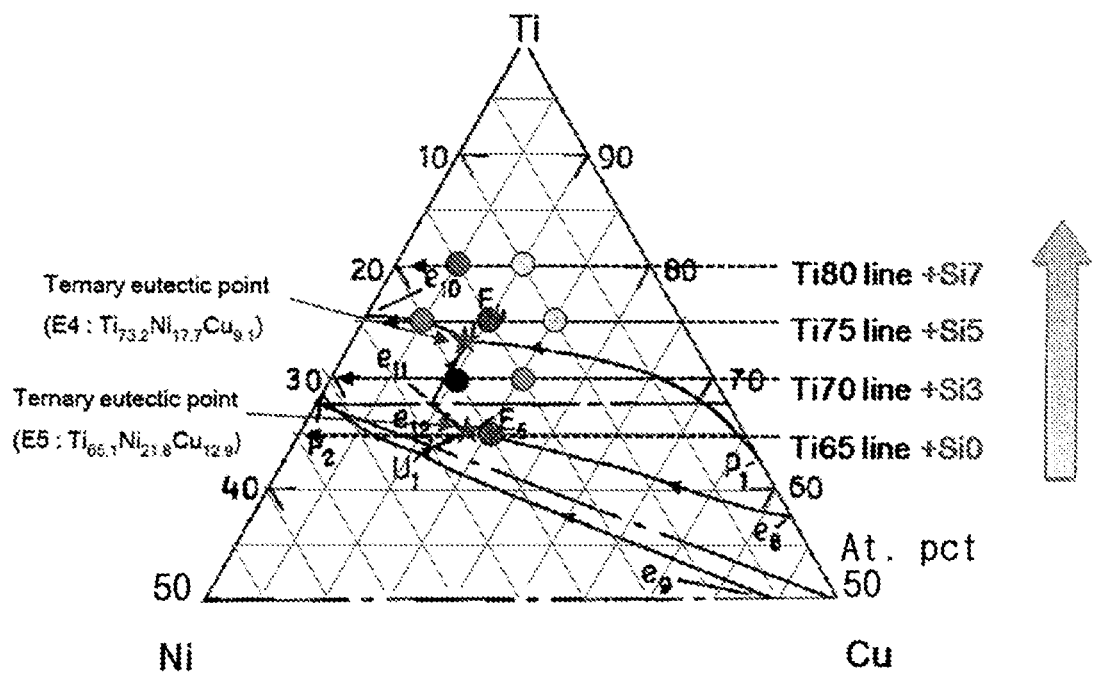
FIG. 19 shows a Gibbs triangle with respect to a Ti—Cu—Ni ternary alloy, indicating a composition regime in which a glass forming ability is examined.

FIG. 19 shows a Gibbs triangle with respect to a Ti—Cu—Ni ternary alloy, indicating a composition regime, in which a GFA is examined.

As shown in FIG. 19, the ternary alloy has two ternary eutectic points (represented by star in FIG. 9) in the composition range; one is an eutectic point corresponding to a composition of Ti-17.7% Ni-9.1% Cu referred as "E4", and the other one is an eutectic point corresponding to a composition of Ti-21.8% Ni-12.9% Cu referred to as "E5".

In the present disclosure, the GFA of Ti—Cu—Ni—Si quaternary alloy having a wide range from a composition regime (Ti lean) in which a content of Ti is less compared to the composition corresponding to E5 to a composition regime in which the content of Ti is greater (Ti rich) compared to the E4 was examined.

Figure 20:
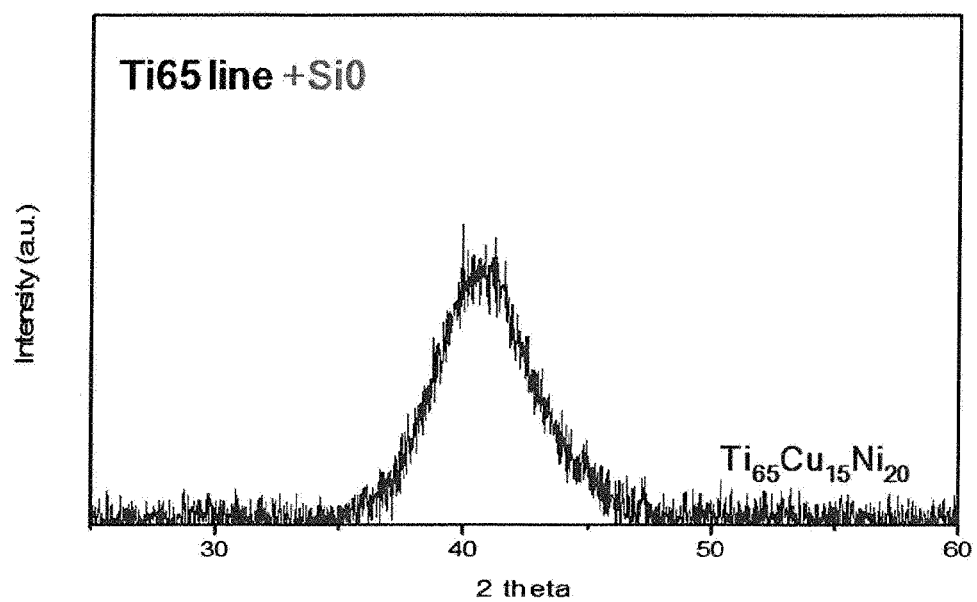
FIG. 20 shows XRD patterns indicating a glass forming ability of an alloy having a composition range of Ti 65%-Cu 15%-Ni 20%.

FIG. 20 shows XRD results with respect to a Ti 65%-Cu 15%-Ni 20% ternary alloy near a composition corresponding to E5. FIG. 20 shows a widely diffused halo form, which is a typical XRD pattern of amorphous phases, indicating that almost all of the microstructure of the ternary alloy having the above composition is amorphous.

Figure 21:
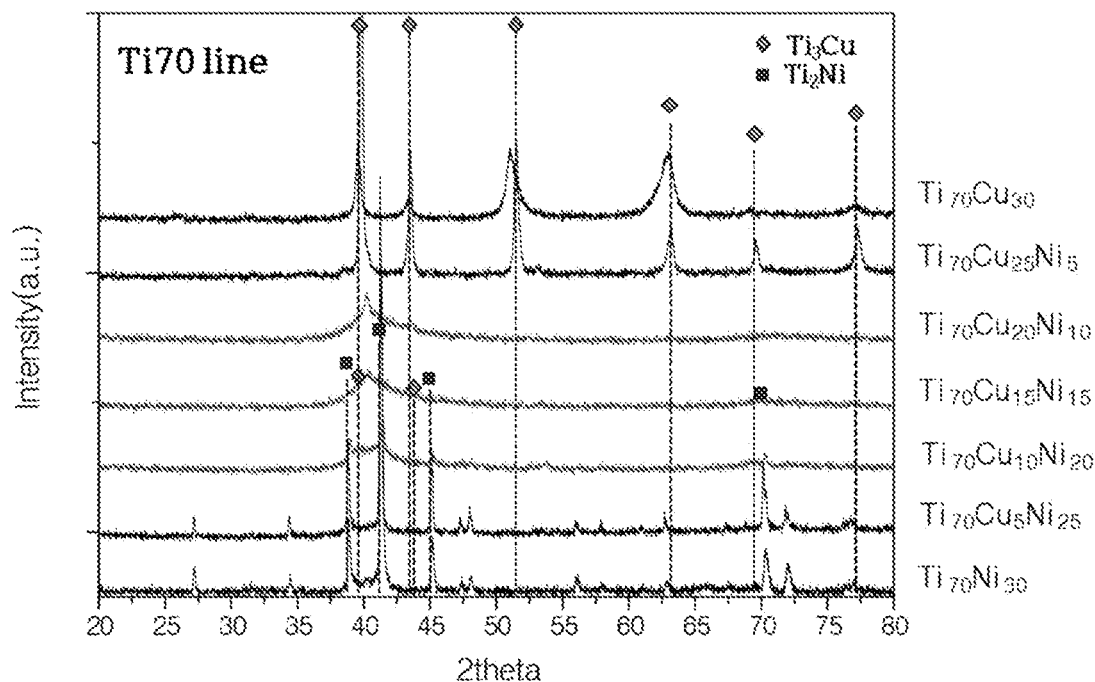
FIG. 21 shows XRD patterns indicating a glass forming ability of ternary alloys that have a composition range of Ti 70%-Cu x %-Ni y % (x+y=30).
Figure 22:
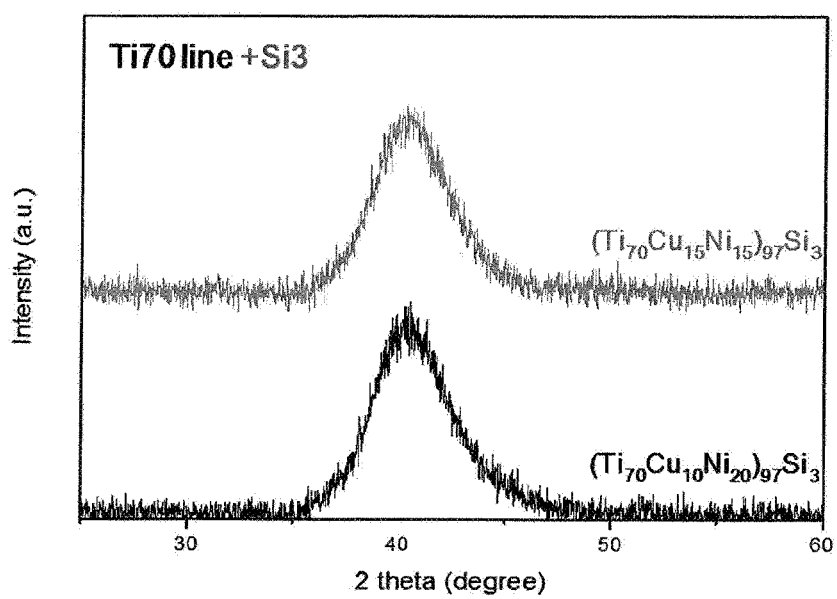
FIG. 22 shows XRD patterns indicating a glass forming ability of a quaternary alloy, in which 3% of Si is added to a Ti 70 line in FIG. 19.

FIGS. 21 and 22 show XRD results of examining GFA of Ti—Cu—Ni ternary alloy and Ti—Cu—Ni—Si quaternary alloy, including 70% of Ti, respectively.

First, from the XRD results, it can be seen that, in a composition regime in which a content of Cu+Ni is 30%, the content of Cu is 20 to 10%, and the content of Ni is 10 to 20%, in the Ti—Cu—Ni ternary alloy, the main phase is amorphous (FIG. 21). Furthermore, when the content of Ni is increased from 10% to 20% in the composition range, a weak diffraction peak with respect to the $Ti_2Ni$ phase is observed from the XRD results. The results show that the Ti-10% Cu-20% Ni ternary alloy has a composite microstructure in which the $Ti_2Ni$ phase coexists in the amorphous main phase.

Meanwhile, it was confirmed that a Ti—Cu—Ni—Si quaternary alloy in which 3% of Si is added to the Ti—Cu—Ni ternary alloy has also a GFA in the composition regime in which a content of Cu+Ni is 30% and a content of Cu is 20 to 10%, and a content of Ni is 10 to 20% (FIG. 22).

However, in the Ti-10% Cu-20% Ni ternary alloy, a portion of the microstructure has a $Ti_2Ni$ phase which is a crystalline phase (FIG. 21), while it can be seen from FIG. 22 that almost pure amorphous phase substantially including no crystalline $Ti_2Ni$ phase is formed, in the (Ti-10% Cu-20% Ni)$_{97}Si_3$ quaternary alloy (the alloy in which 3% of Si is included in 97% of (Ti-10% Cu-20% Ni) alloy, and the total composition corresponds to a Ti-9.7% Cu-19.4% Ni-3% Si alloy). These results directly indicate that the addition of 3% of Si greatly improves the GFA of the Ti—Cu—Ni—Si quaternary alloy.

Figure 23:
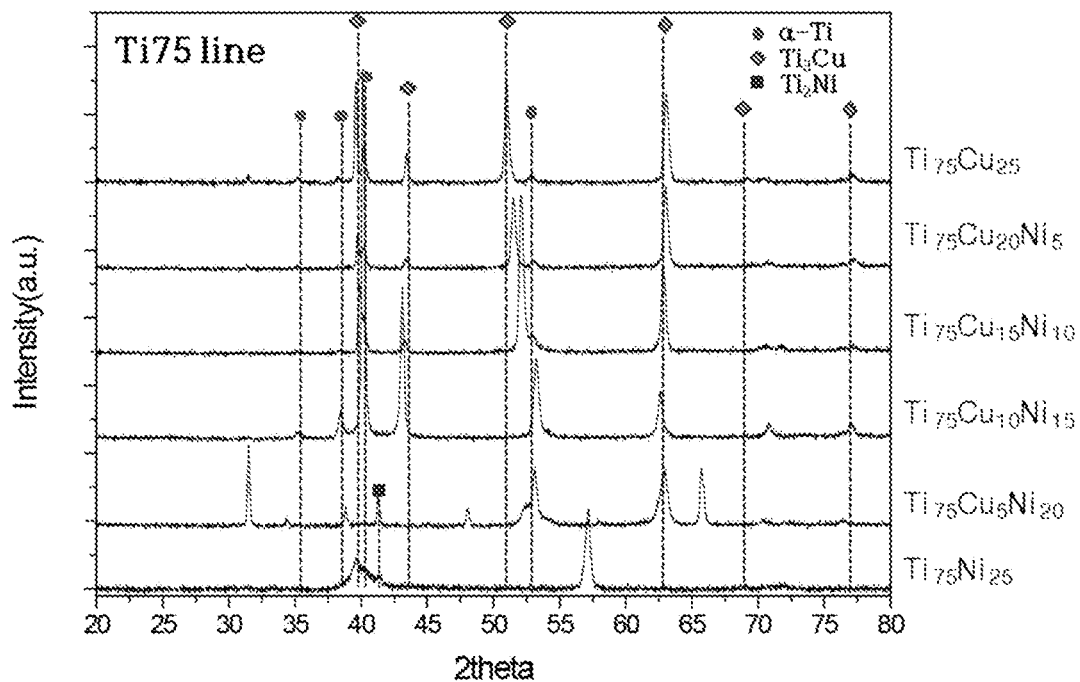
FIG. 23 shows XRD patterns with respect to a glass forming ability of ternary alloys that have a composition range of Ti 75%-Cu x %-Ni y % (x+y=25).
Figure 24:
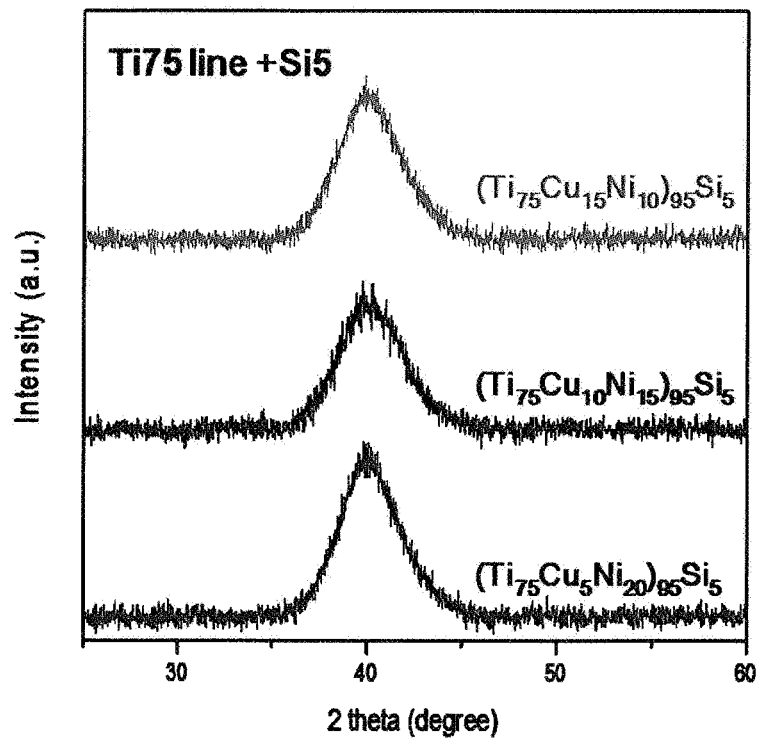
FIG. 24 shows XRD patterns with respect to a glass forming ability of a quaternary alloy in which 5% of Si is added to a Ti 75 line in FIG. 19.

FIGS. 23 and 24 are XRD results of examining GFA of a Ti—Cu—Ni ternary alloy and a Ti—Cu—Ni—Si ternary alloy including 75% of Ti, respectively.

First, in the Ti—Cu—Ni ternary alloy, it was confirmed that there is no GFA, in the examined overall composition regime of the ternary alloy including 75% of Ti, which indicates that there is no substantial GFA, in the T-Cu—Ni ternary alloy system including greater amount of Ti compared to the composition corresponding to E4.

However, unlike the ternary alloy system, it was confirmed that the T-Cu—Ni—Si quaternary alloy system in which 5% of Si is included in the Ti—Cu—Ni ternary alloy system has the GFA in the composition regime (a composition that meets a requirement of Ti+Cu+Ni=95%) in which the content of Cu+Ni is 25% and the content of Cu is 5 to 15%, and the content of Ni is 10 to 20%. It was also examined that the quaternary alloy exists only as a substantially pure amorphous phase substantially including no inter-metallic compound or silicide.

Figure 25:
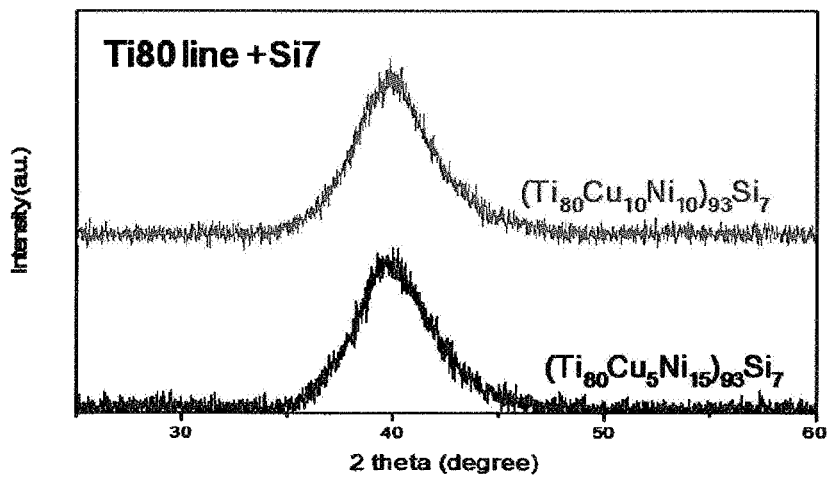
FIG. 25 shows XRD patterns with respect to a glass forming ability of a quaternary alloy in which 7% of Si is added to a Ti 80 line in FIG. 19.

FIG. 25 shows XRD results of examining GFA of a Ti—Cu—Ni—Si quaternary alloy including 80% of Ti.

As shown in test results of Example 1 performed by the present inventors, it was confirmed that the T-Cu—Ni ternary alloy system to which 80% or more of Ti is added has no GFA in the examined entire composition regime.

However, unlike the ternary system, it was confirmed that the T-Cu—Ni—Si quaternary alloy system including 7% of Si has the GFA in the composition regime (a composition that meets a requirement of Ti+Cu+Ni=93%) in which the content of Cu+Ni is 20% and the content of Cu is 5 to 10%, and the content of Ni is 10 to 25%. It was also examined that this quaternary alloy also exists only as a substantially pure amorphous phase substantially including no inter-metallic compound or silicide.

Figure 26:
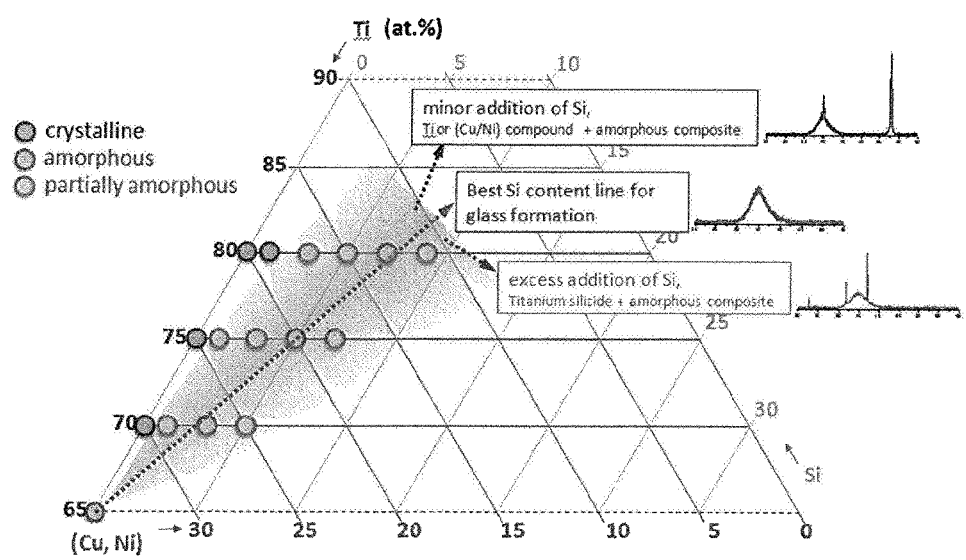
FIG. 26 shows an overall composition range of a Ti—Cu—Ni—Si quaternary alloy examined as having a glass forming ability.

FIG. 26 summarizes a GFA of the Ti—Cu—Ni—Si quaternary alloy, tested in the above, in the examined total composition range.

First, in FIG. 26, the test results of XRD patters show that the GFA is provided and a microstructure is almost made of amorphous material, in the composition regime corresponding to an arrow made of dotted lines which extends from lower left to the upper right. Meanwhile, the GFA is provided in the composition regime which is shaded in the left side of the arrow and a main phase is an amorphous phase and some inter-metallic compounds are included in terms of microstructure. To the contrary, the GFA is provided in a composition regime shaded at the right side of the arrow, and the composition regime in which a main phase is an amorphous phase and including some silicide is shown.

From test results in Example 2 in the above, it was confirmed that Ti—Cu—Ni—X quaternary alloy having a composition range of 59.2 to 80% of Ti, 4.6 to 20% of Cu, 4.6 to 25% of Ni, 9% or less of Si (excluding 0%) has stable GFA.

Embodiment 3: Ti—Cu—Ni—X Quaternary Amorphous Alloy

The amorphous alloy in Example 3 of the present disclosure further includes a B2 phase, in addition to Ti-based amorphous alloy as described in the previous embodiments.

According to the present disclosure, a B2 phase is a crystalline phase and refers to a TiNi inter-metallic compound in the Ti—Ni binary phase diagram of FIG. 4, which corresponds to a thermodynamically equilibrium phase. A crystal structure of the B2 phase is a so-called CsCl type in which one of Ti atom or Ni atom is placed at a body center of a body centered cubic (BCC) and the other atom is placed at an angular point of BCC.

As shown also in FIG. 2, the elastic modulus (~89 GPa) of B2 phase in the third embodiment of the present disclosure is lower than the elastic modulus of a typical crystalline metal as well as the elastic modulus (~100 GPa) of an amorphous material having the related composition. Meanwhile, the B2 phase is known to undergo ultra-high elastic deformation through reversible phase change during deformation, and has a ultra-high elastic strain of about 2.0% or more.

In general, as the elastic strain increases, resilience increases, which is defined as the product of the elastic modulus and the elastic strain, and fracture toughness corresponding to an area in a stress-strain curve also increases. The fracture toughness refers to an energy absorbed until a material is fractured. As a result, when the elastic strain is increased, an energy that may be absorbed until the material is fractured is increased, and thereby it is more difficult for the material to be fractured. Thus, the increase in the elastic strain may lead to an improvement in the reliability of components.

On the other hand, it is known that a B19 or B19' martensite phase has, unlike the B2 phase, an orthorhombic or monoclinic crystal structure and has a lower elastic modulus (~69 GPa). However, unlike the B2 phase, it is known that it undergoes a general an elastic strain, and the elastic strain of B19 or B19' martensite phase is less than that of the B2 phase.

In Embodiment 3 of the present disclosure, a Ti-based amorphous alloy including the B2 phase that may have lower elastic modulus and higher elastic strain compared to the amorphous microstructure, in addition to the amorphous microstructure having low elastic modulus and high elastic strain, compared to crystalline material or metal nitride is invented.

Particularly, when the phase B2 capable of reversible phase change is included in the amorphous phase, a higher elastic strain may be obtained because friction, abrasion property, dimensional stability, and durability thereof may be significantly improved by increasing an amount of elastic strain of bearing that causes friction with a piston or a cylinder which is a component having high strength in the compressor, and the like, in particular, a component such as an inner ring of a gas bearing.

To this end, according to the present disclosure, the Ti amorphous alloy further includes Cu, in addition to Ni which forms the B2 phase on the Ti base, while providing the GFA. As shown in FIG. 3, when Cu is added to Ti, the melting point of the Ti base alloy may be lowered in a similar manner with Ni. In addition, the Ti—Cu alloy has a very wide composition range to have the GFA, which indicates that Cu is an alloy element which is advantageous to stably provide the GFA of the Ti-based alloy.

As crystalline alloys are mainly made, in the Ti-based alloys, in a general composition and through general manufacturing method thereof, the composition having the GFA is generally narrow. However, if there is the GFA only in an excessively narrow composition range, there is a limitation to an improvement in various types of properties depending on the composition. Therefore, the present disclosure stably provides the GFA of the Ti-based alloy first by adding Cu.

Next, in Embodiment 3 of the present disclosure, when Mo, which is a stabilizing element of a structure of a body centered cubic (BCC) is added to the Ti—Cu—Ni ternary alloy by a threshold value or more, it was found that the B2 phase is stably precipitated in the amorphous main phase under rapid cooling rates of $10^5$ K/s.

Figure 27:
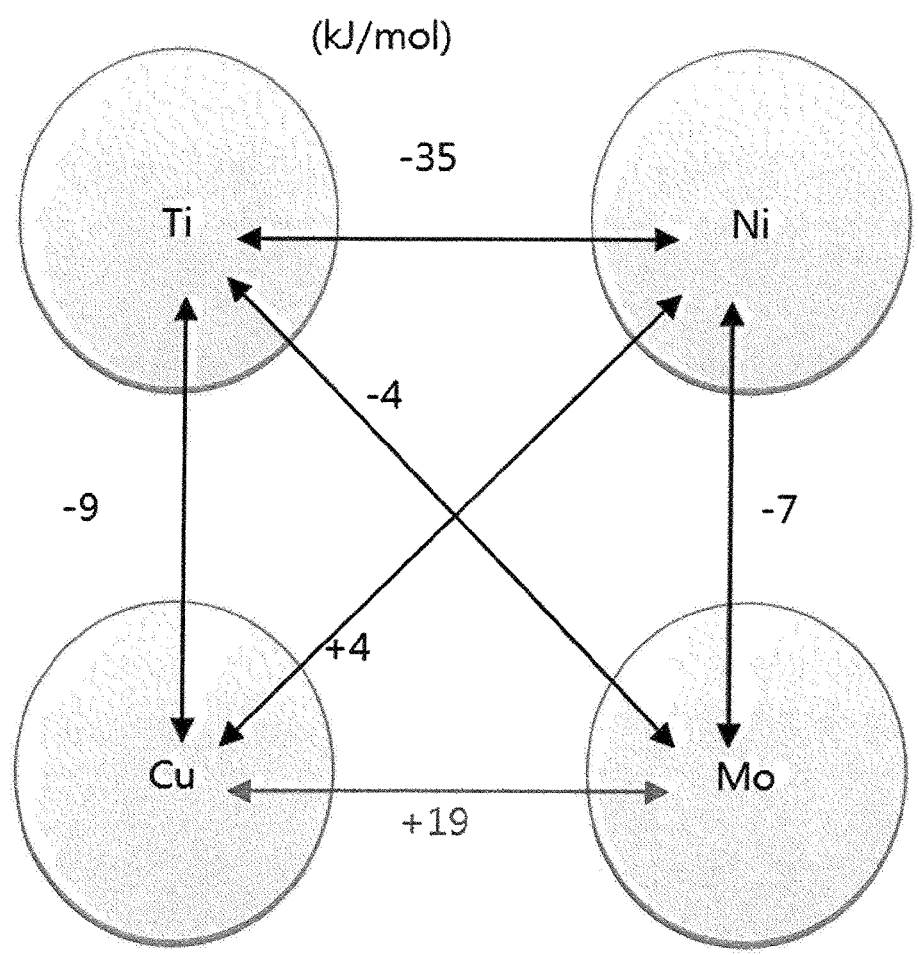
FIG. 27 shows heat of mixing between components of a Ti—Cu—Ni—Mo quaternary alloy.

As described above, in general, it is required to meet a few empirical laws to form amorphous materials stably. As one of these laws, it is known that the larger the negative heat of mixing between components of the amorphous alloy, the excellent the GFA. However, as shown in FIG. 27, it was examined that Mo may not have negative heat of mixing having a greater value, with respect to the heat of mixing with Ti, Cu, and Ni.

In the present disclosure, a new Ti-based amorphous alloy including the B2 phase is invented by the inventors, by adding Mo, based on the Ti—Cu—Ni ternary alloy having the stable GFA in the wide composition range. Furthermore, according to the present disclosure, Ti—Cu—Ni—Si—Mo quinary alloy is designed to stably obtain the B2 phase and obtain the stable GFA.

Figure 28:
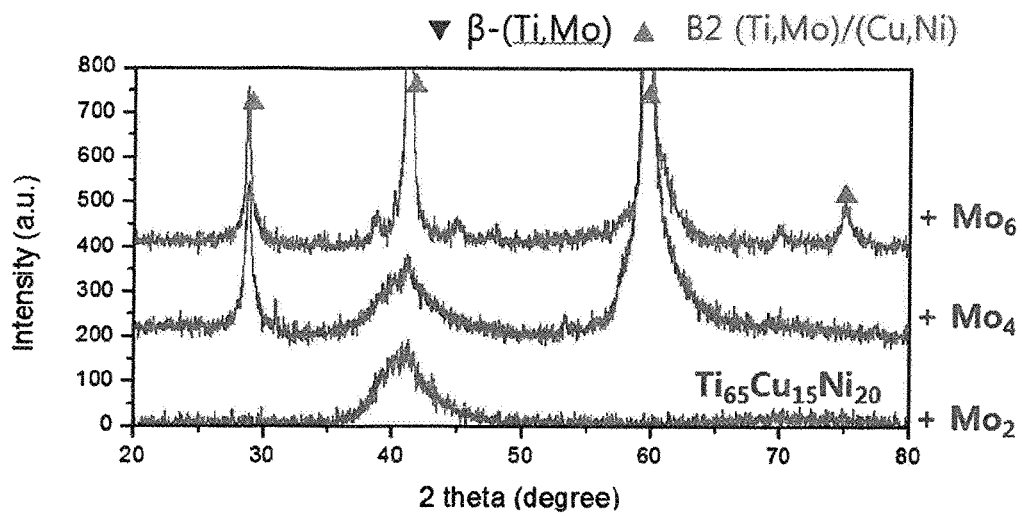
FIG. 28 shows an X-ray diffraction pattern (hereinafter; referred to as "XRD") of a Ti—Cu—Ni—Mo quaternary alloy.

FIG. 28 shows XRD results with respect to quaternary alloy in which Mo is added to Ti-15% Cu-20% Ni alloy, indicated by atom % (hereinafter; referred to as "%") in Embodiment 1 invented by the present inventors.

First, XRD patterns of (Ti-15% Cu-20% Ni)$_{98}$—Mo$_2$ alloy including 2% of Mo based on a total composition range (referring to an alloy in which 2% of Mo is added to 98% of alloy having the composition of Ti-15% Cu-20% Ni and other alloys indicated in the same manner have the same composition) shows a widely diffused halo shape which is a typical XRD pattern of the amorphous phases. The XRD results show that all microstructures of the quaternary alloy having the above composition are made of crystalline material.

Meanwhile, when the content of Mo is increased to 4%, XRD peaks of crystalline B2 phases are observed, in addition to the existing amorphous XRD patterns, which indicate that a composite microstructure is formed, in which amorphous phases and B2 phases are mixed with each other in the quaternary alloy in which 4% of Mo is added.

Meanwhile, when the content of Mo is increased to 6%, the pattern having the inherent halo shape of the existing amorphous material almost disappears, in the XRD patterns, and only peaks corresponding to BCC beta($\beta$)(Ti) and crystalline material B2 exist, which means that the quaternary alloy in which 6% of Mo is added refers to the crystalline alloy, rather than the amorphous alloy.

Meanwhile, it was predicted, when the quinary alloy in which Mo is added to Ti-41% Cu-7% Ni-1% Si adding Si, which reduces the content of Ti and improves the GFA at the same time has stable GFA for the following reasons, in addition to factor of lowering the melting point due to the low content of Ti, compared to the quaternary alloy in the above.

As described above, FIG. 18 shows heat of mixing and differences in radiuses between components of the Ti—Cu—Ni—Si quaternary alloy. Si, Ti, and Cu and Ni have the negative heat of mixing having a greater absolute value, compared to heat of mixing of components of the Ti—Cu—Ni ternary alloy, which indicates that the addition of Si promotes an improvement in the GFA based on the empirical laws related to the heat of mixing to form the amorphous material as described above.

Meanwhile, further to the empirical rules related to the heat of mixing, a greater difference in atomic radius of 12% or more between components that form the amorphous alloy has been known to increase the GFA. However, the atomic radius of Si is different from the atomic radius of Ti, Cu and Ni by at least 12% or more. Therefore, the addition of Si has an advantageous effect on formation of amorphous material even in terms of atom size.

Figure 29:
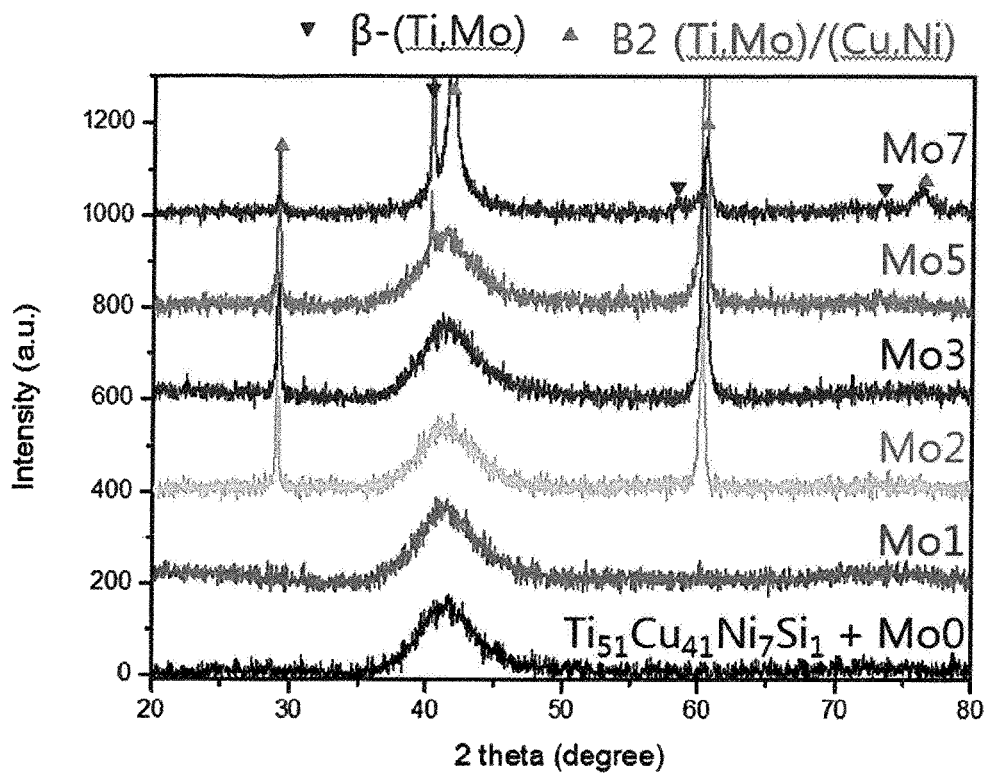
FIG. 29 shows XRD patterns of a Ti—Cu—Ni—Si—Mo quinary alloy.

FIG. 29 shows XRD results with respect to a quinary alloy in which Mo is added to a Ti-41% Cu-7% Ni-1% Si alloy.

First, the XRD patterns with respect to the Ti-41% Cu-7% Ni-1% Si alloy not including Mo and (Ti-41% Cu-7% Ni-1% Si)$_{99}$Mo$_1$ alloy in which 1% of Mo is added show a widely diffused halo shape which is a typical XRD pattern of amorphous phases. These XRD results show that the quaternary or quinary alloy having the above composition has microstructure all or almost all of which (slight peak with respect to B2 is observed with respect to the alloy in which 1% of Mo is added) are made of amorphous materials.

Meanwhile, when the content of Mo is increased to 2%, XRD peaks of crystalline B2 phases are observed in addition to the existing amorphous XRD pattern, which indicates that in the (Ti-41% Cu-7% Ni-1% Si)$_{98}$Mo$_2$ alloy, a composite microstructure in which amorphous phases and crystalline B2 phase are mixed is formed. The XRD results in FIG. 29 show that, in the composite structure in which the crystalline B2 phase is mixed with the amorphous matrix or the main phase, the composition range in which the content of Mo is 5% is maintained.

Meanwhile, when the content of Mo is increased to 7%, the existing inherent halo pattern of the amorphous material disappears in the XRD pattern, and only peaks corresponding to BCC beta ($\beta$)(Ti) and crystalline B2 exist, which indicates that the (Ti-41% Cu-7% Ni-1% Si)$_{93}$Mo$_7$ alloy is a crystalline alloy, rather than an amorphous alloy.

Figure 30:
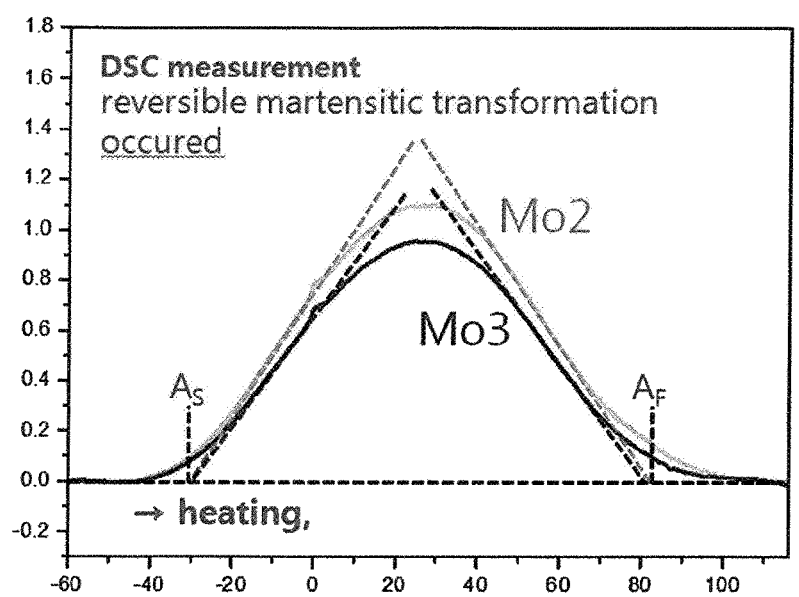
FIG. 30 shows a result of DSC analysis of an alloy in which 2 to 3 at. % of Mo is added, in a Ti—Cu—Ni—Si—Mo quinary alloy.

Meanwhile, FIG. 30 shows DSC test results of the above quinary alloy in which 2 to 3% of Mo is added. In the quinary alloy in which 2 to 3% of Mo is added, a reaction peak was observed in a low-temperature regime during heating, and initiation and termination temperatures of the reaction were examined to be constant regardless of an amount of Mo added. This reaction corresponds to a reversible reaction between crystalline B2 and martensite phase, which is typically reported in the Ti—Ni alloy system. In other words, when the quinary alloy that has the above composition is cooled, the precipitated B2 phase is transformed into crystalline martensite at a low temperature, and when it is heated again, the phase thereof is changed to the B2 phase. Behavior occurring due to the reversible phase change that is made according to the temperature of the B2 phase is also possible in the same context depending on the stress change and indicates that the phase measured by the XRD pattern of the present disclosure corresponds to the phase B2 capable of reversible phase change.

From the XRD results in FIGS. 28 and 29 and the DSC results in FIG. 30, it was confirmed that addition of Mo induces precipitation of crystalline B2 phase, in the Ti amorphous alloy in the present disclosure. On the other hand, in view of the composition range to have the composite microstructure including the amorphous phase+crystalline B2 phase, it was confirmed that the composition range of Mo is very narrow, that is, about 2%, in the Ti—Cu—Ni—Mo quaternary amorphous alloy, while the composition range of Mo is extended to about 1 to 5%, in the Ti—Cu—Ni—Si—Mo quinary amorphous alloy.

From the above test results, it was confirmed that the quaternary or quinary alloy including Ti—Cu—Ni—(Si)—Mo having the composition range of 51 to 65% of Ti, 15 to 41% of Cu, 7 to 20% of Ni, 1% or less of Si (including 0), and 1 to 5% of Mo has the GFA, as well as stably having the crystalline B2 phase.

<Sputtering Target>

Hereinafter, a sputtering target proposed by the present disclosure will be described.

The sputtering process is widely used in semiconductor manufacturing fields, microelectronic devices such as MEMS, and for coating to improve durability in motors, and compressors.

When a thin film that has an amorphous phase or a composite amorphous thin film including a nanocrystalline material is produced using the sputtering process, used sputtering target may be a crystalline or an amorphous target. However, in amorphous targets, a target surface is locally increased in temperature due to collision of plasma ions during sputtering, and this increase in temperature may again cause changes in microstructure of the target surface.

More specifically, as amorphous phase is a thermodynamically unstable phase, an increase in the temperature of the target causes crystallization that transforms the thermodynamically unstable amorphous material to the thermodynamically stable crystalline material at the target surface. However, such localized crystallization may lead to volume change and structural relaxation of the target, which increases brittleness of the target, resulting in even extreme results in which the target is fractured during the sputtering.

Therefore, in order to obtain excellent thermal stability of the sputtering target and to improve reliability of the sputtering process, a sputtering target having a microstructure in a composition range having a GFA was produced. More specifically, a sputtering target having a crystalline microstructure was produced using a Ti amorphous alloy having the compositions as exemplified in Examples 1 to 3 in the present disclosure.

First, in the present disclosure, a Ti alloy having a composition which is found to have a GFA in the above embodiments is dissolved through vacuum arc melting, and then an amorphous alloy in the form of a ribbon or a foil is obtained using the melt spinning method. Then, after a plurality of ribbons are stacked, they are hot-pressed in a temperature range higher than a crystallization starting temperature (it is a clear matter for the skilled person in the art to easily measure it from the DSC analysis in FIG. 12) corresponding to the compositions of the ribbons and lower than the melting point to obtain a sputtering target made of the crystalline material.

As coupling thereof proceeds due to inter-diffusion between ribbons, the amorphous alloy ribbons are crystallized during hot-pressing, and a time in which the hot-pressing is maintained takes long after the crystallization, grain growth also occurs. Further, an interface between stacked alloy ribbons during this process may be destroyed due to inter-diffusion of atoms.

It is preferable that the grain size of the sputtering target having the microstructure finally crystallized or grain-grown has a range of 0.1 to 10 µm. As the crystallization may not be sufficiently provided due to the grain size less than 0.1 µm, it is not preferable in terms of providing the thermal stability of the target. To the contrary, the crystallization may be sufficiently provided when the grain size is greater than 10 µm; however, it is disadvantageous in terms of stability and uniformity of the plasma process and uniformity of the final composition of the coating layer.

Meanwhile, in still another method, a crystalline sputtering target may be prepared using an amorphous alloy powder having a composition exemplified in the embodiments. In this case, a crystalline sputtering target may be produced by sintering aggregates of amorphous alloy powders manufactured through atomizing method at high temperatures or pressurizing the aggregates at high temperature and sintering the aggregates. In this case, the sintering temperature has a range in which the sintering temperature is higher than the crystallization starting temperature, in the composition of the alloy powder, and lower than the melting temperature.

In another example, in the same manner as a method of casting copper mold, a melt is injected to an inside of a mold such as copper having high cooling capacity, for example, a copper mold, through a nozzle, using a difference between a pressure inside of the mold and a pressure outside of the mold and is rapidly solidified, to produce an amorphous alloy casting material having a predetermined shape. Thereafter, a crystalline alloy target may be obtained through annealing.

<Compressor Including Coating Layer>

Hereinafter, a solid coating layer and a mechanical device (for example, a compressor) including the solid coating layer proposed by the present disclosure will be described.

The coating layer of the present disclosure is applicable to all moving parts or components, but in the present disclosure, as a simplest example, a compressor that has a structure using a rotation of the rotary shaft is illustrated.

Figure 31:
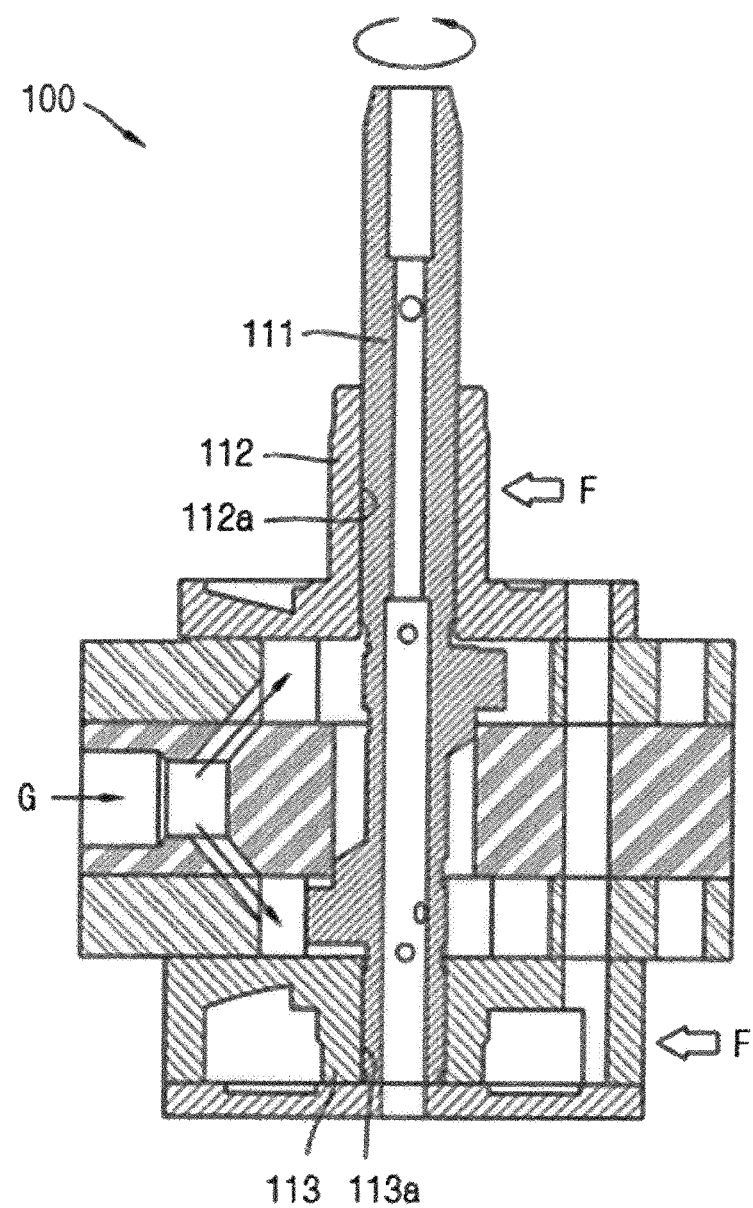
FIG. 31 shows any type of compressor that uses a rotary shaft and a bearing, to which a solid coating layer is used, according to the present disclosure.

FIG. 31 is a partial cross-sectional view of a compressor related to the present disclosure. FIG. 31 shows any type of compressor 100 using a rotary shaft 111 and bearings 112, 113.

The rotary shaft 111 rotates to compress gas during operation of the compressor 100. The bearings 112 and 113 cover at least a portion of the rotary shaft 111. The bearings 112 and 113 are fixed thereto to rotate relative to the rotary shaft 111. The bearings 112 and 113 may include a main bearing 112 (or a first bearing) and a sub-bearing 113 (or a second bearing).

When the compressor 100 is operated, gas is introduced, from one side of the rotary shaft 111 during rotation of the rotary shaft 111. Further, a reaction force F is formed in a direction opposite to a gas force G due to the introduced gas. Therefore, the rotary shaft 111 constantly contacts the bearings 112 and 113 during the rotation of the rotary shaft 111.

The coating layer is formed at friction portions 112a and 113a of the rotary shaft 111 and the bearings 112 and 113 to implement the abrasion resistance and the low friction. The coating layer may be deposited on at least one of the rotary shaft 111 and the bearings 112 and 113. The coating layer is made of a Ti-based amorphous alloy having the composition to have the GFA described in the embodiments in the present disclosure.

In the present disclosure, the coating layer is not applied only to the contact portion between the rotary shaft 111 and the bearings 112 and 113. For example, the coating layer may be applied to a contact portion with other components that the rotary shaft may contact, for example, a frame or a sub-frame. Further, the coating layer of the present disclosure may be applied to compressor components rather than the rotary shaft or the bearing. For example, the coating layer may be applied to a friction portion of a cylinder, a rolling piston, a vane, and the like in a rotary compressor. Finally, the coating layer of the present disclosure may be applied to all components, tools and apparatuses, other than the compressor, in which the friction or the abrasion may occur.

On the other hand, a component such as the rotary shaft above which the coating layer is formed, that is, the base of the coating layer is not particularly limited. However, it is preferable to include at least any one of steel, iron, aluminum-containing alloy, and magnesium-containing alloy, which are currently commercially available and widely used because metals such as the above steel, iron, the aluminum-containing alloy, the magnesium-containing alloy have a collateral effect of promoting the GFA of the coating layer due to high heat conduction.

While the present disclosure has been described with reference to exemplary drawings thereof, the present disclosure is not limited to embodiments and drawings described in the present disclosure, and various changes can be made by the skilled person in the art in the scope of the technical idea of the present disclosure. Further, in the description of embodiments of the present disclosure, working effects obtained based on configurations of the present disclosure are not explicitly described, it is needless to say that effects predicted based on the corresponding configurations have also to be recognized.

The invention claimed is:

1. A Ti-based amorphous alloy having a composition of materials in atomic %, the Ti-based amorphous alloy comprising:
   67.5 to 70% of titanium (Ti);
   10 to 17.5% of copper (Cu); and
   15 to 20% of cobalt (Co).

2. A sputtering target comprising the Ti-based amorphous alloy of claim 1.

3. The sputtering target of claim 2, wherein a microstructure of the sputtering target is made of a crystalline material.

4. The sputtering target of claim 3, wherein an average grain size of the sputtering target ranges from 0.1 to 10 µm.

5. The Ti-based amorphous alloy of claim 1, wherein Cu is less than 15% of the composition.

6. A Ti-based amorphous alloy having a composition of materials in atomic %, the Ti-based amorphous alloy comprising:
   48.4 to 65% of titanium (Ti);
   14.3 to 41% of copper (Cu);
   8.6 to 20% of nickel (Ni);
   1 to 5% of molybdenum (Mo); and
   greater than 0% and less than or equal to 1% of silicon (Si).

7. The Ti-based amorphous alloy of claim 6, wherein Ni is greater than 15% of the composition.

* * * * *